United States Patent
Ito et al.

(10) Patent No.: US 7,062,732 B2
(45) Date of Patent: Jun. 13, 2006

(54) SEMICONDUCTOR DEVICE, METHOD OF GENERATING PATTERN FOR SEMICONDUCTOR DEVICE, METHOD OF MANUFACTURING SEMICONDUCTOR DEVICE AND DEVICE FOR GENERATING PATTERN USED FOR SEMICONDUCTOR DEVICE

(75) Inventors: Mitsumi Ito, Nagaokakyo (JP); Junichi Shimada, Osaka (JP); Kiyohito Mukai, Takatsuki (JP); Hiroyuki Tsujikawa, Kusatsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 280 days.

(21) Appl. No.: 10/634,989

(22) Filed: Aug. 6, 2003

(65) Prior Publication Data
US 2004/0102034 A1 May 27, 2004

(30) Foreign Application Priority Data
Aug. 6, 2002 (JP) ............... P. 2002-229216

(51) Int. Cl.
*G06F 9/45* (2006.01)
(52) U.S. Cl. ............... 716/5; 716/8; 716/10

(58) Field of Classification Search ............... 716/8, 716/19, 10, 5
See application file for complete search history.

(56) References Cited

U.S. PATENT DOCUMENTS

| 5,631,492 | A | | 5/1997 | Ramus et al. |
| 5,885,856 | A | | 3/1999 | Gilbert et al. |
| 6,157,067 | A | * | 12/2000 | Hsu et al. ............... 257/369 |
| 6,434,730 | B1 | * | 8/2002 | Ito et al. ............... 716/8 |
| 6,467,070 | B1 | * | 10/2002 | Kuroda et al. ............... 716/8 |
| 6,551,895 | B1 | * | 4/2003 | Hsu et al. ............... 438/396 |

FOREIGN PATENT DOCUMENTS

| JP | 2000-208634 | 11/2000 |
| JP | 2001-356279 A | 12/2001 |

* cited by examiner

*Primary Examiner*—Stacy A. Whitmore
(74) *Attorney, Agent, or Firm*—McDermott Will & Emery LLP

(57) ABSTRACT

To provide a semiconductor device characterized in that: a decoupling capacitor can be increased; noise generated from an electric power supply can be effectively absorbed; and a stable operation of a circuit can be realized.

Irrespective of whether or not a region is close to a power supply wiring or a ground wiring, MOS is spread all over a spare area of a chip and connected to a power supply wiring and ground wiring by utilizing a wiring layer and diffusion layer.

21 Claims, 19 Drawing Sheets

(4,6,8)  (5,7,9)

A (4,6,8)  (5,7,9) A

MOST APPROPRIATE AREA RATIO

DUMMY PATTERN D2

IN THE CASE WHERE AREA RATIO IS TOO LOW, DUMMY CELL IS REPLACED WITH ONE OF HIGH DENSITY

AREA RATIO IS TOO LOW

DUMMY PATTERN D1

SEMICONDUCTOR DEVICE, METHOD OF GENERATING PATTERN FOR SEMICONDUCTOR DEVICE, METHOD OF MANUFACTURING SEMICONDUCTOR DEVICE AND DEVICE FOR GENERATING PATTERN USED FOR SEMICONDUCTOR DEVICE

BACKGROUND OF THE INVENTION

1. Field of the Invention

The present invention relates to a semiconductor device, a method of generating a semiconductor device, a method of manufacturing a semiconductor device and a device for generating a semiconductor device. More particularly, the present invention relates to the generation of a pattern used for a semiconductor device capable of reducing electromagnetic interference noise even in the case of driving the device at high speed.

2. Description of Related Art

The use of LSI has spread far and wide, of course, in the field of computers and further in the fields of correspondence equipment such as cellular phones, electric appliances, toys and automobiles. On the other hand, electromagnetic interference (EMI) generated by the above products causes problems of jamming of electric waves in radio and television receiving sets. Further, electromagnetic interference (EMI) generated by the above products could be a cause of malfunction of the other systems.

In order to solve the above problems, it is possible to take measures of filtering or shielding so that the entire product can be covered. However, these countermeasures have disadvantages of increasing the number of parts and also increasing the manufacturing cost, that is, it is difficult to take measures for the entire product. From the above viewpoints, there is a strong demand of suppressing the occurrence of noise from the LSI package.

In the above circumstances, LSI is positioned as a key device of each product. In order to ensure competitiveness of the product, there is a demand of increasing the scale and processing speed of LSI. In order to meet the above demands while the product cycle is being shortened, it is indispensable to automatize to design LSI, and it is necessary to adopt the synchronization designing as a condition of introducing the technique of automatizing to design. When the entire circuit is operated in synchronization with the reference clock, an intensity of the instantaneous electric current is increased so high especially in the case of a large scale and high speed LSI. Accordingly, an increase in the electromagnetic interference is caused.

Since LSI is made fine and the operation frequency of LSI is increased, the countermeasures of solving the problems of latch-up and noise have become important.

In general, in the designing method on the cell base, when diffusion regions and through-holes are formed in the substrate cells, contacts are formed, and the substrate or the well is fixed to a power supply electric potential via the contacts. However, when substrate contacts are added to the basic cells to take measures to solve the problems of latch-up, the chip area is increased.

Therefore, the present inventors proposed the following method (JP-A-2000-208634). In order to prevent the chip area from increasing, substrate contacts are arranged below the electric power supply wiring. When a condenser which bypasses a cell is arranged between the electric power supply wiring and the ground wiring, while an increase in the area of the semiconductor device is being suppressed, the withstanding voltage of latch-up is increased, and the emission of noise is reduced and the malfunction caused by noise coming from the outside is reduced.

Further, the following method is proposed (Japanese Patent Application No. 2001-356279). In order to reduce the occurrence of noise generated from an electric power supply when the semiconductor device is made fine and the operation frequency is increased, a space area in which no layout pattern exists is detected and a region adjacent to the electric power supply wiring region is detected. A decoupling capacitor is arranged in a region obtained when these detected regions are subjected to logic operation.

According to the above method, the decoupling capacitor is arranged being added to the space area, which is a region adjacent to the electric power supply wiring region, in which no layout pattern exists. Therefore, it is possible to further increase the decoupling capacitor.

According to the above methods, it is possible to reduce the noise generated from the electric power supply. However, the semiconductor device has been further made fine and the operation frequency has been further increased at present. Therefore, it is very important to add a much larger decoupling capacitor.

Especially, in the case of designing a semiconductor chip, the development of LSI of which has been completed and the layout of which has been verified, when electromagnetic interference (EMI) is calculated for the entire semiconductor chip and the decoupling capacitor is formed as a countermeasure to reduce EMI, it is necessary to provide a much larger decoupling capacitor.

Even when the decoupling capacitor is increased, the following problems may be encountered. In the case where the layout pattern biases, it is impossible to obtain sufficiently high pattern accuracy for the layer concerned. Further, the pattern accuracy of the upper layer with respect to the layer concerned is affected. Therefore, it is impossible to obtain sufficiently high process accuracy.

Therefore, in some cases, it is desirable that wiring work is automatically conducted while consideration is being given to the process condition again at the final stage of deciding the chip layout.

SUMMARY OF THE INVENTION

The present invention has been accomplished in view of the above actual circumstances. It is an object of the present invention to provide a semiconductor device characterized in that a decoupling capacitor can be increased; noise generated from an electric power supply can be effectively absorbed, and a stable operation of a circuit can be realized.

It is another object of the present invention to make it easy to automatize to generate a pattern so as to positively enhance the pattern accuracy.

In order to accomplish the above objects, according to the method of the present invention, irrespective of a region adjacent to the electric power supply wiring or the ground wiring, MOS capacitor is spread all over the space area of the chip and connected to the electric power supply wiring and the ground wiring by utilizing the wiring layer and the diffusion layer.

The present invention provides a method of generating a pattern for a semiconductor device comprising: a layout pattern forming step of designing and arranging a layout pattern of a function element according to function information of a semiconductor chip; a space area detecting step of detecting a space area in which no layout pattern exists; a judging step of judging whether or not an MOS capacitor cell, the insulating film of which is a gate oxide film, can be arranged in the space area; a step of arranging the MOS capacitor cell in the space judged that the MOS capacitor cell can be arranged; and a wiring arrangement step of forming a wiring so that a gate conductor of the MOS capacitor cell can be connected to a first electric potential and a substrate can be connected to a second electric potential.

According to the above method, it is possible to conduct an automatic design of increasing a decoupling capacitor when a space area is detected, an MOS capacitor cell is formed in the space area and wiring is conducted at a necessary position. In this connection, in the step in which the MOS capacitor cell is arranged, from the viewpoint of utilizing the space area most effectively, it is desirable that cells are arranged in the entire region which is judged in the judging step that the cells can be arranged, and the thus arranged cells are deleted if an arrangement of the cells is not allowed by a restriction in the later step.

It is preferable that the wiring arrangement step includes a step in which the gate conductor of the MOS capacitor cell is connected to a wiring of an electric power supply and a step in which the substrate is connected to a ground wiring.

It is preferable that the wiring arrangement step includes a step in which a wiring layout pattern is generated so that a contact for connecting a wiring formed on an upper layer to the gate conductor can be formed and the wiring can be connected to the electric power supply wiring.

It is preferable that a method of generating a pattern for a semiconductor device further comprises a step in which a wiring layout pattern is generated so that a contact of connecting the wiring formed in the upper layer to the substrate can be formed and the substrate can be connected to the ground wiring.

It is preferable that the contact is connected to a contact formed in a portion, in which the electric power supply wiring or the ground wiring exists on a lower layer, via the wiring.

It is preferable that a method of generating a layout pattern for a semiconductor device further comprises a step in which a region having no layout pattern of the function element and having no signal line above is extracted, wherein the wiring is arranged in the extracted region.

It is preferable that the step of generating a layout pattern of the wiring includes: a step of detecting whether or not a front-end layer pattern exists from the layout pattern; a step of detecting whether or not a layout pattern of a function element exists on the same layer; and a step of extracting a region in which a wiring can be generated.

It is preferable that the step of generating a layout pattern of a wiring includes: a step of detecting whether or not a front-end pattern exists from the layout pattern and also detecting whether or not an upper layer pattern exists from the layout pattern; a step of detecting whether or not a layout pattern of a function element exists on the same layer; and extracting a region in which an intermediate layer wiring, which is located between the front-end layer pattern and the upper layer pattern, can be generated.

It is preferable that the wiring arrangement step is composed so that two continuous layers of dummy pattern cells have a cross like pattern and the dummy pattern cell of each layer has an island-shaped isolated pattern in a region corresponding to a cross region of the cross like pattern. The dummy pattern is a pattern formed additionally in order to obtain a most appropriate area ratio. According to the above constitution, when MOS capacitor cell is connected to a desired electric potential such as a power supply electric potential or a grounding potential, it is possible to reduce the wiring length and conduct the connection easily. It is possible to easily control a connecting condition by whether or not through-holes are formed on an isolated pattern for connecting or not connecting being kept in a floating state.

Concerning the decoupling capacitor which has been spread right below the electric power supply, when vias are provided right above the decoupling capacitor, it can be easily connected to the power supply electric potential. In the case where the electric power supply wiring is an upper layer, if an upper portion of the MOS capacitor cell is open, that is, if a signal line is not formed, vias and pads for stacking are automatically formed.

On the other hand, concerning the MOS capacitor cell arranged at a position distant from the electric power supply wiring, when the wiring is formed into a cross-shape at the same pitch as that of the cell, the connection can be easily accomplished.

It is preferable that the dummy pattern cell is composed of a first layer cell having a cross like pattern and an isolated island-shaped pattern in each of the four regions divided by the cross like pattern and also composed of a second layer cell, the pattern of which is a sharp-mark-shape arranged so that it crosses at four points corresponding to the island-shaped pattern, located on an upper layer or a lower layer continuing to the first layer cell, and the first layer and the second layer respectively compose an electric power supply wiring and a ground wiring.

According to the above constitution, it is possible to connect the MOS capacitor cell to a desirable electric potential such as a power supply electric potential or a ground electric potential, and further it is possible to keep the MOS capacitor cell in a floating condition without being connected. Therefore, a very simple dummy pattern can be composed.

It is preferable that a method of generating a pattern for a semiconductor device further comprises: a step of extracting an area ratio from the layout pattern of each layer composing the function element, the MOS capacitor element and the wiring; and a dummy pattern adding step of adding a dummy pattern to the layout pattern so that the area ratio of the mask pattern of each layer can be adjusted to be the same while giving consideration to the most appropriate area ratio of the layout pattern for each layer obtained according to the process condition of each layer composing the layout pattern, wherein the area ratio of each layer is adjusted to be the same.

According to the above method, when a dummy pattern is left even in a region in which the pattern is unnecessary from the viewpoint of the function of the circuit while consideration is given to the process condition, it is possible to prevent the occurrence of a case in which the etching seeds and injection ions are concentrated, and further it is possible to prevent the formation of flatness from the macro-viewpoint. Therefore, it is possible to enhance the pattern accuracy, optimize the impurity profile of the diffusion layer and make the surface flat. "The most appropriate area ratio" is a most appropriate ratio of an area occupied with the pattern in the pattern forming area(an entire substrate surface). The most appropriate area ratio is often not only a point, but also can be in a range between a value and another value. In such a case, a center point in the range of area ratio is preferably defined as the most appropriate area ratio. For example, in the case that an appropriate range is a range between 50% and 70%, 60% is applied as the most appropriate ratio. Because even if the ratio is deviated a little from the most appropriate ratio, in case that the ratio is within the appropriate range in almost all cases, and as a result, a formation of an accurate pattern can be performed. Further, a point nearly to a designed ratio in the range of area ratio wherein accurate pattern can be obtained in the process condition, can be selected.

It is preferable that a method of generating a semiconductor device further comprises: a step of dividing a layout pattern, which is formed in the layout pattern forming step, into small regions of a predetermined size; a step of extracting an area ratio of the layout pattern for each small region divided; and a dummy pattern adding step of adding a dummy pattern so that the area ratio of a mask pattern can be adjusted to be the same, wherein the area ratio of each layer for each small region is adjusted to be the same.

According to the above constitution, when the area ratio is adjusted to be the same for each small region, the area ratio of the entire layer concerned can be optimized. When the size and the pitch of the dummy pattern to be added are adjusted for each small region, the area ratio can be easily optimized. In this case, small region can be a region divided eaqually. And region can be divided according to the function.

It is preferable that a method of generating a pattern for a semiconductor device further comprises: a step of preparing a plurality of types of dummy pattern cells, the area ratios of which are different from each other; and the dummy pattern adding step including a step of selecting a predetermined dummy pattern cell according to the area ratio of the small region concerned.

According to the above constitution, when the most appropriate dummy pattern cell is selected from the dummy damper cells, the area ratios of which are different from each other, the area ratio can be easily adjusted to be same. Therefore, the area ratio can be optimized for the entire layer concerned. Concerning a plurality of types of dummy damper cells, when an additional dummy pattern cell, the size and pitch of which are different, is prepared for each small region, the most appropriate dummy damper cell can be easily selected.

It is preferable that a method of generating a pattern for a semiconductor device further comprises a step in which an area ratio after the dummy pattern has been formed is calculated, it is judged whether or not the area ratio is in a predetermined range, when the area ratio is not in the predetermined range, some of the dummy patterns are replaced, and the most appropriate dummy cell is calculated.

It is preferable that the dummy pattern adding step is executed for at least one of the wiring layer, the diffusing layer, the gate conductor and the well.

As described above, it is possible to automatically, effectively generate a pattern of the semiconductor device.

The present invention provides a device for generating a pattern used for a semiconductor device comprising: a layout pattern forming means for forming a layout pattern from layout data of a semiconductor chip; a space area detecting means for detecting a space area in which no layout pattern exists on the semiconductor chip; a logic operation means for conducting a logic operation of a region detected by the space area detecting means and a design rule while consideration is given to technology by the design rule from the layout pattern formed by the layout pattern forming means; and an arranging means for arranging a region extracted by the logic operation means so that it can be a decoupling capacitor adding arranging region.

A method of manufacturing a semiconductor device of the present invention comprises: a step of forming a mask pattern in each step according to a pattern used for a semiconductor device generated by the above method or the above device; and a step of executing each process with the mask pattern so as to form a semiconductor device.

A semiconductor device of the present invention comprises a pattern used for a semiconductor device generated by the above method or the above device.

It is preferable that a semiconductor device is characterized in that the semiconductor device is an aggregation composed of dummy capacitor cells of the same size; and the semiconductor device includes at least one dummy capacitor cell not electrically connected.

In this connection, the functional element includes a functional element composing LSI such as a transistor, memory and wiring.

DETAILED DESCRIPTION OF THE PREFERRED EMBODIMENTS

Figure 1:
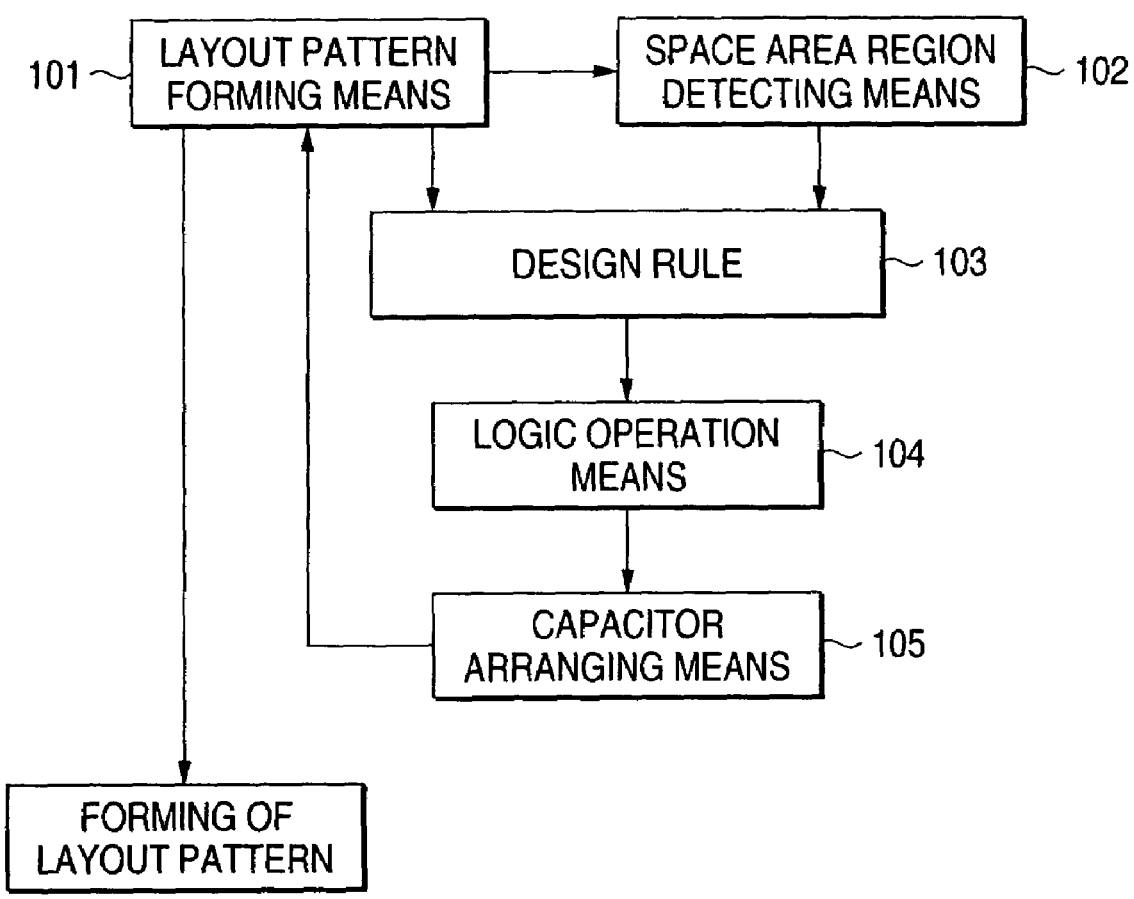
FIG. 1 is a block diagram showing a pattern generating device of the first embodiment of the present invention.

Referring to the drawings, embodiments of the present invention will be explained in detail as follows.

First Embodiment

FIG. 1 is a block diagram showing a pattern generating device of an embodiment of the present invention. This device includes: a layout pattern forming means 101 for designing and arranging a layout pattern of a semiconductor chip; a space area detecting means 102 for detecting a space area in which no layout pattern exists on the semiconductor chip; a logic operation means 104 for conducting a logic operation on the region, which has been detected by this space area detecting means 102, and on the design rule while consideration is given to the technology by the design rule 103 from the layout pattern formed by the layout pattern forming means; and an arranging means 105 for making the region, which has been extracted by this logic operation means, to be a decoupling capacitor addition arranging region, wherein the decoupling capacitor is additionally arranged in the space area, and the layout pattern data, to which data is added again, is outputted from the layout pattern forming means 101.

In this case, the technology by the design rule is defined as the technology calculated by the design rule. The size of a member such as a cell, bypass condenser or wiring is defined by the design rule of each process such as diffusion, spattering or etching.

Figure 2:
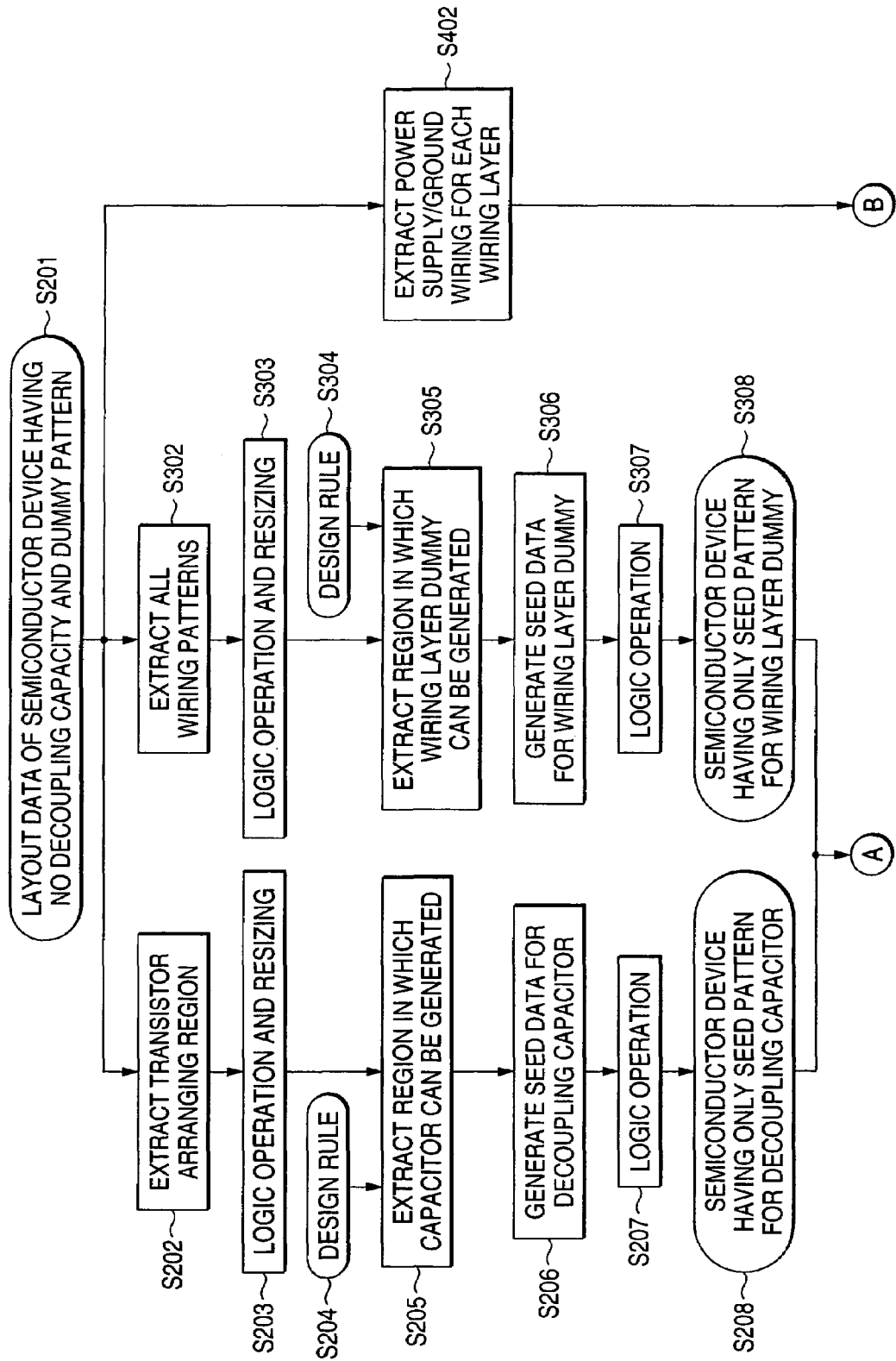
FIG. 2 is a flow chart showing a pattern generating method of the first embodiment of the present invention.
Figure 3:
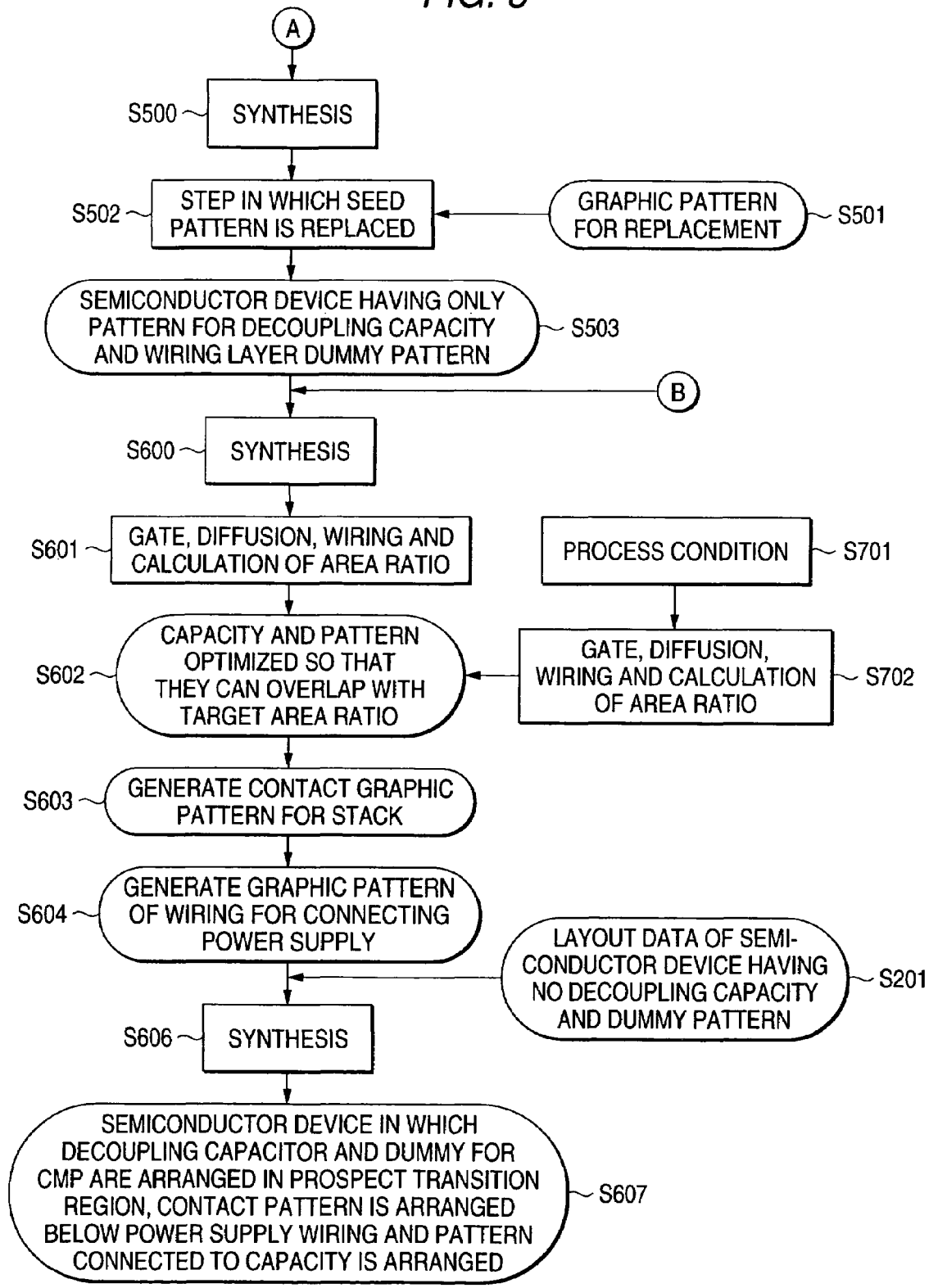
FIG. 3 is a flow chart showing a pattern generating method of the first embodiment of the present invention.

As shown by the flow chart illustrated in FIGS. 2 and 3, a layout pattern, to which the MOS capacitor is added, is formed by this pattern generating device.

Figure 4:
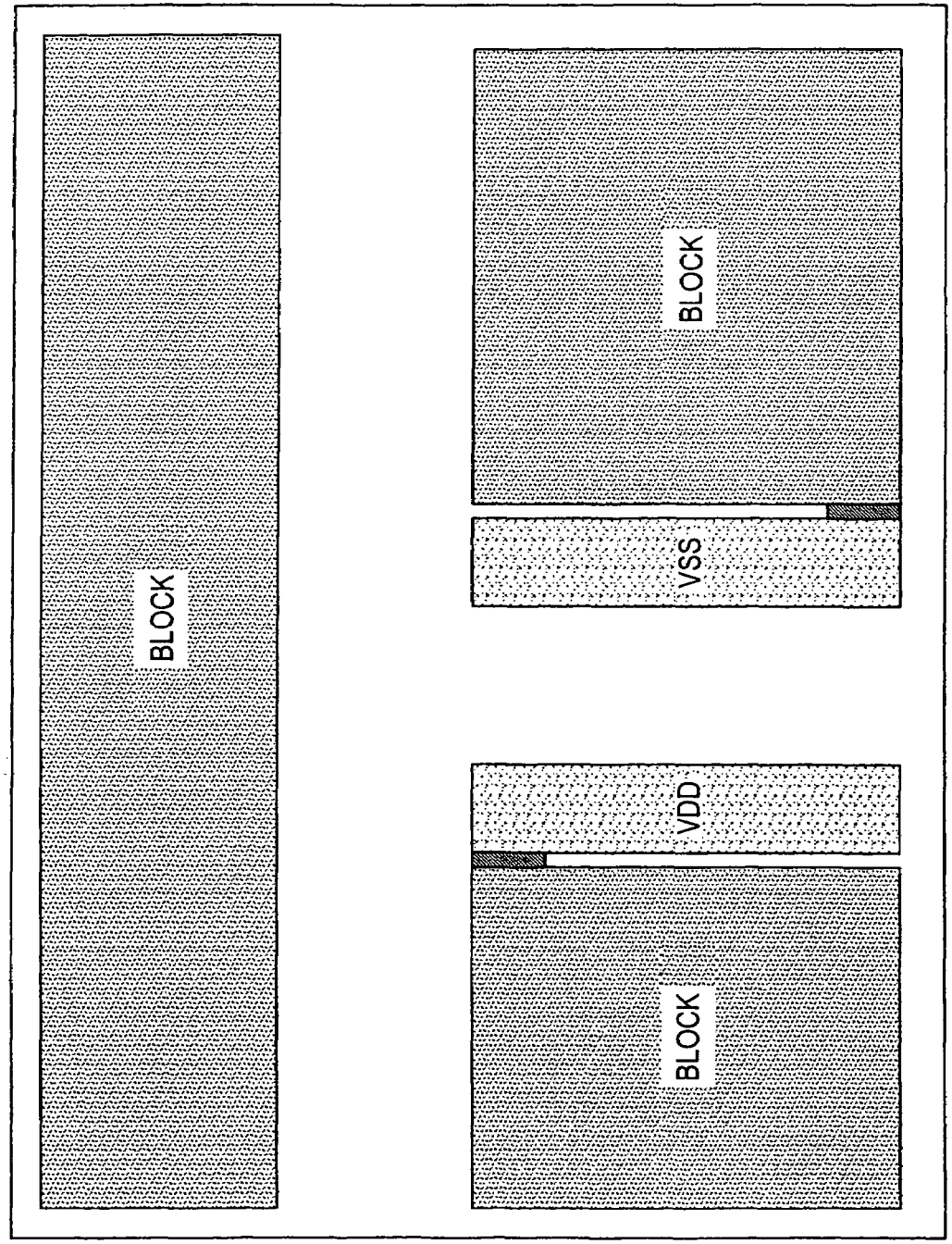
FIG. 4 is a schematic illustration showing a pattern generating process of the first embodiment of the present invention.
Figure 5:
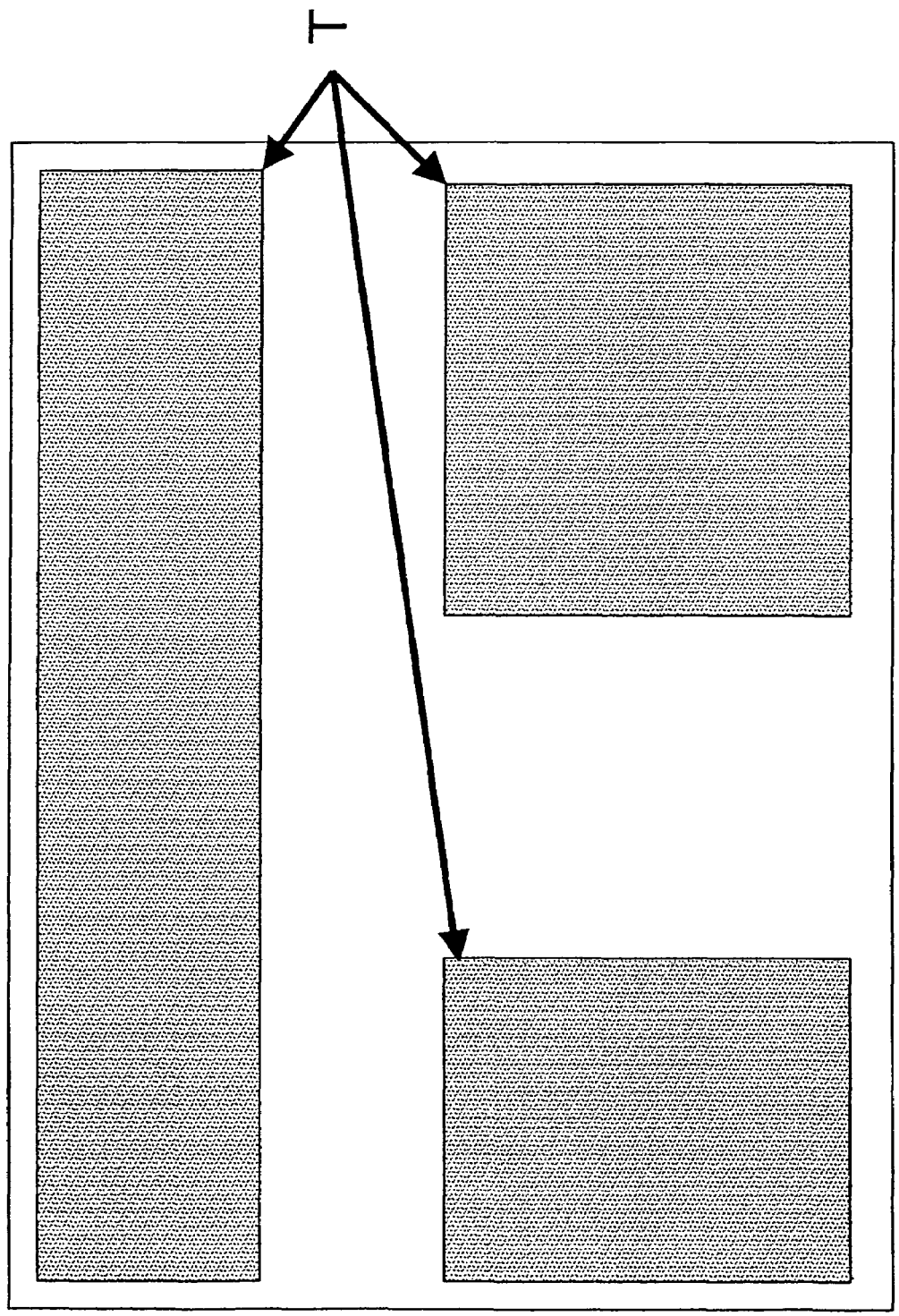
FIG. 5 is a schematic illustration showing a pattern generating process of the first embodiment of the present invention.

From the layout data (shown in FIG. 4) (step S201) of the semiconductor chip, the development of LSI of which has been completed while giving consideration to the countermeasure to electromagnetic interference, and verification of the layout of which has been completed, as shown in FIG. 5, the transistor arranging region T is extracted (step S202). In this case, the layout data is generated all over the steps while the left lower portion and the right upper portion of the semiconductor chip are positioned and the two points concerned are used as a reference.

Figure 6:
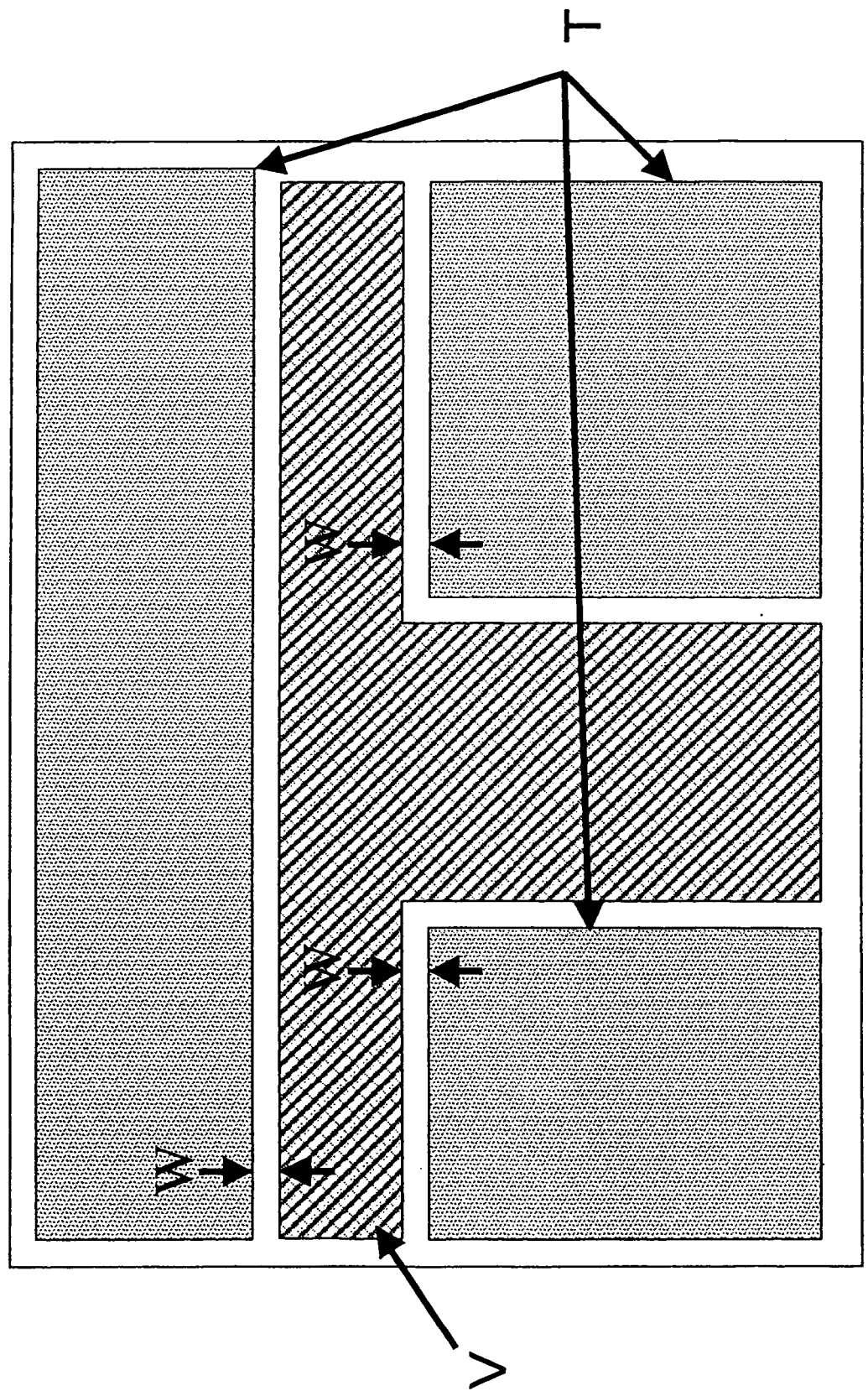
FIG. 6 is a schematic illustration showing a pattern generating process of the first embodiment of the present invention.

When the transistor arranging region T and the semiconductor chip region concerned are subjected to a logic operation and inverted, a region in which no transistor is arranged on the semiconductor chip is extracted, and a resizing step for reducing this region by a predetermined width W is executed (the logic operation step S203). Due to this inversion, the region in which no transistor is arranged is obtained and reduced by resizing. In this way, the space area V in which a cell can be formed is obtained as shown in FIG. 6.

Further while consideration is being given to a distance between the adjacent patterns capable of being formed according to the design rule (S204), the region capable of being formed is extracted (step S205).

After that, the seed pattern S for the decoupling capacitor is generated (step S206).

Figure 7:
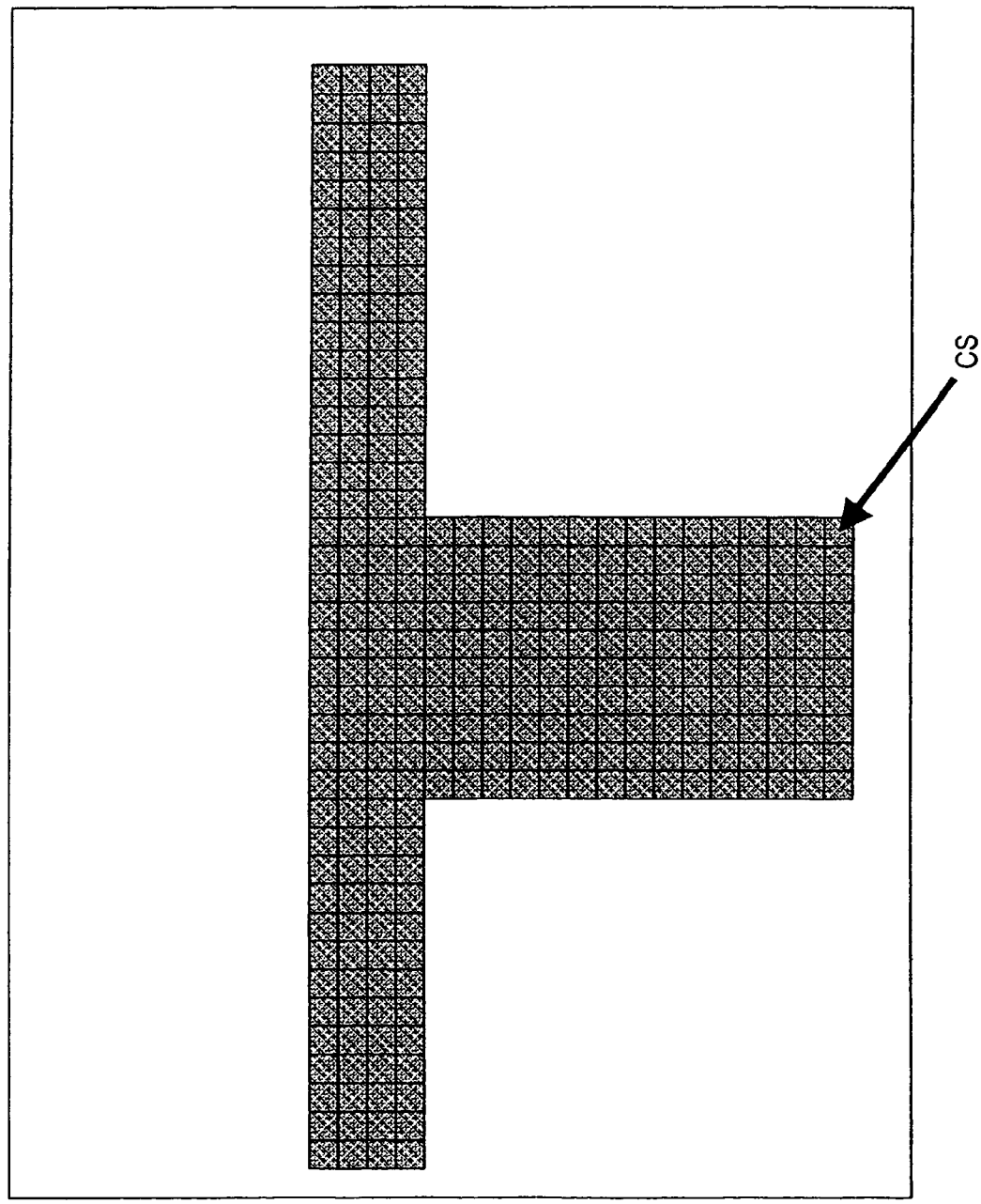
FIG. 7 is a schematic illustration showing a pattern generating process of the first embodiment of the present invention.

Then, this seed pattern S for the decoupling capacitor and the space area are subjected to a logic operation (step S207), and the layout pattern for the semiconductor device only for the seed pattern CS for the decoupling capacitor is obtained as shown in FIG. 7 (step S208).

The entire pattern P is extracted from the layout data (S201) of the semiconductor chip (step S302).

When the wiring pattern arranging region P and the semiconductor chip region concerned are subjected to a logic operation and inverted, a region in which the wiring is not arranged on the semiconductor chip is extracted, and a resizing step in which this region is reduced by a predetermined width W is executed (logic operation step S303). By this inversion, the region in which the wiring is not arranged can be obtained. When this region is reduced by resizing, the space area VC in which the wiring layer dummy cell can be formed can be obtained.

Further, while consideration is being given to the distance between the patterns adjacent to each other capable of being formed according to the design rule (S304), a region in which a dummy wiring can be formed is extracted (step S305).

After that, the seed data D for the dummy wiring is generated (step S306).

Figure 8:
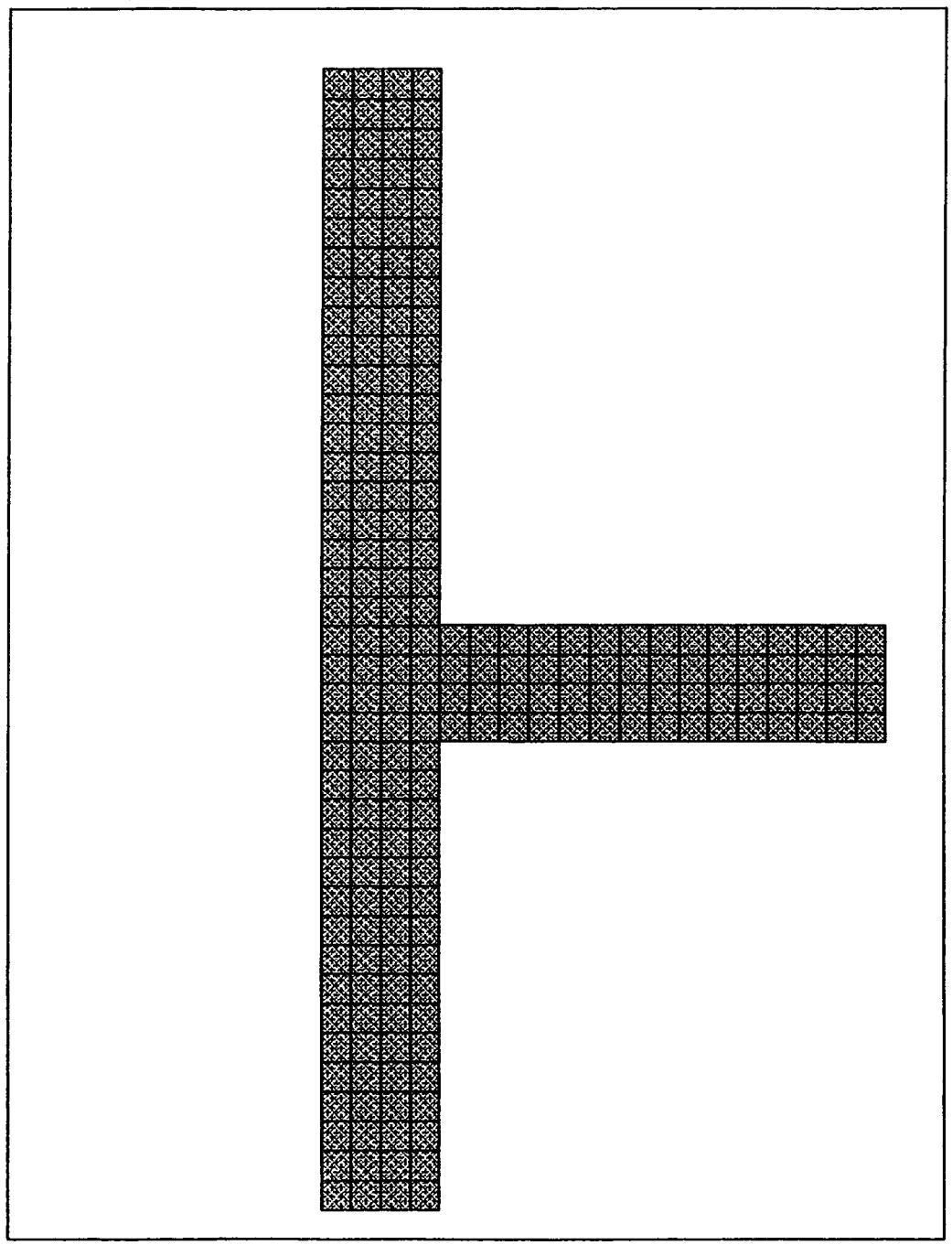
FIG. 8 is a schematic illustration showing a pattern generating process of the first embodiment of the present invention.

Then, this seed data D for the dummy wiring and the space area VC, in which the wiring layer dummy cell can be formed, are subjected to a logic operation (step S307), and a semiconductor device only for this seed data for the wiring layer dummy is obtained as shown in FIG. 8 (step S308).

Figure 9:
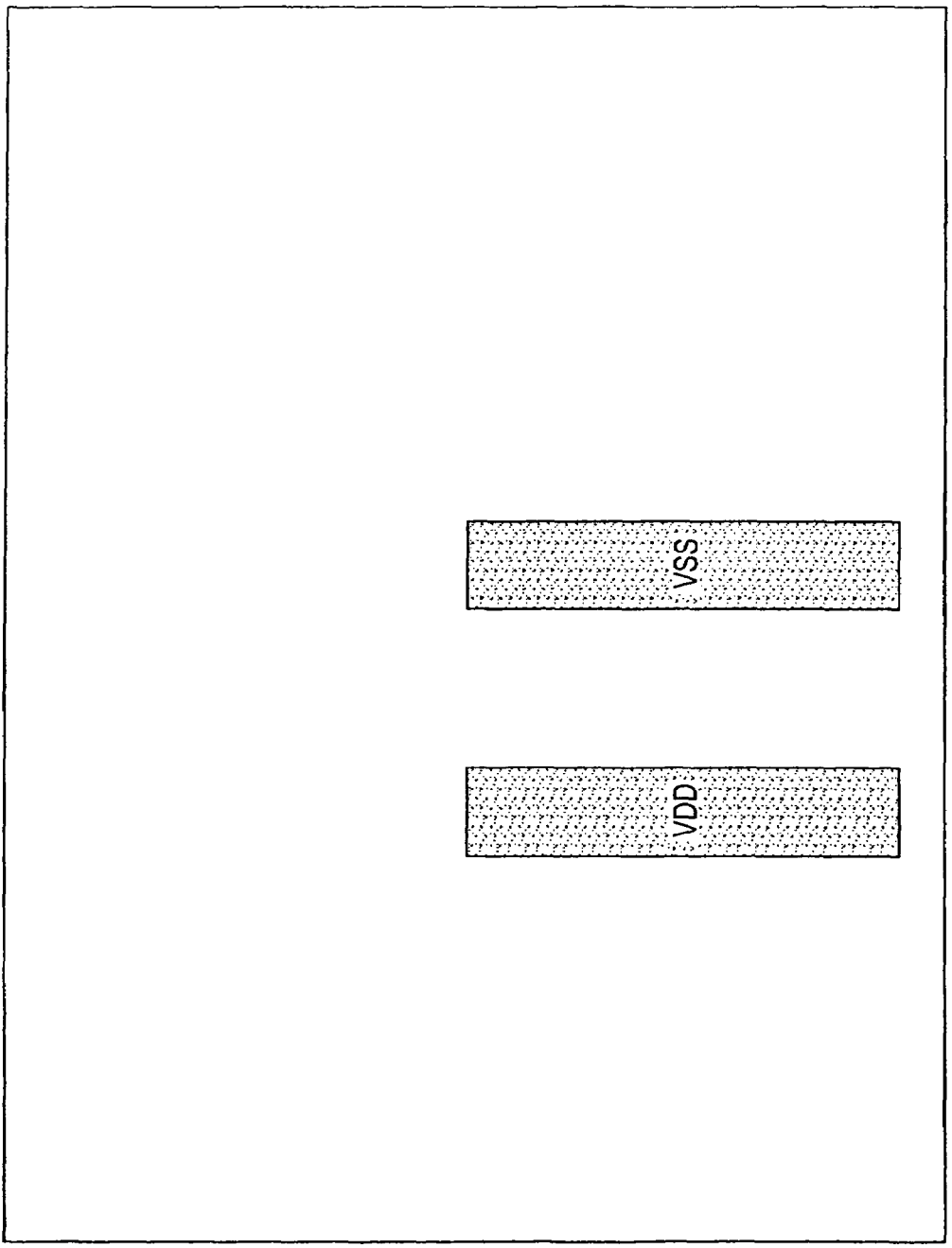
FIG. 9 is a schematic illustration showing a pattern generating process of the first embodiment of the present invention.

Further, from the layout data of the semiconductor chip (S201), the patterns of the electric power supply and the ground wiring are extracted for each wiring layer as shown in FIG. 9 (step S402).

The seed data for the wiring layer dummy and the seed data for the decoupling capacitor are synthesized with each other (step 500). In the synthesizing region, a plurality of graphic patterns for replacement are prepared (step 501). In the case of a region, which extends to a boundary so that it can not be formed, the seed pattern is replaced (step 502), and a semiconductor device having only the pattern for the decoupling capacitor and the dummy pattern for the wiring is obtained (step 503).

Figure 10:
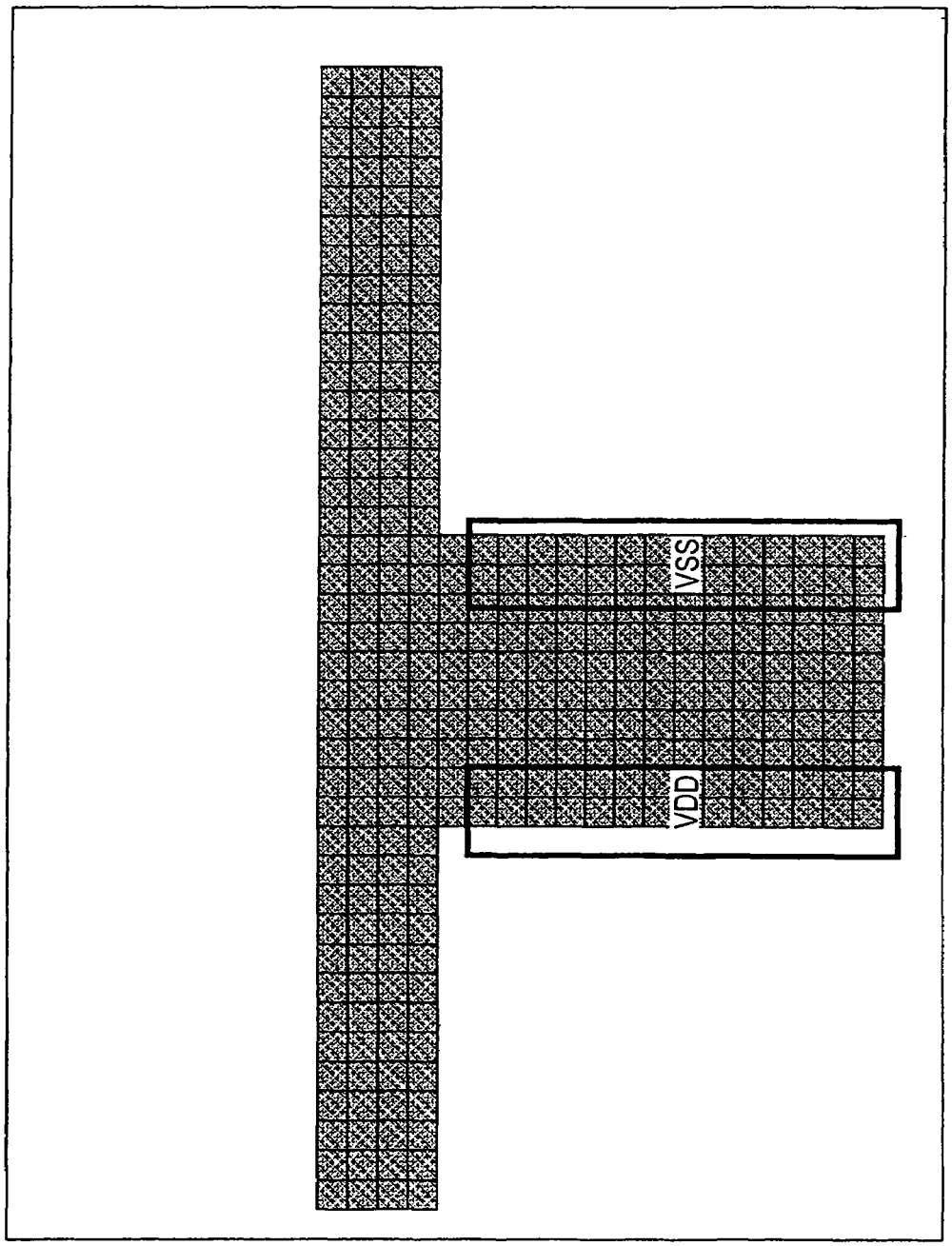
FIG. 10 is a schematic illustration showing a pattern generating process of the first embodiment of the present invention.

After that, each pattern of the electric power supply wiring and the ground wiring, which are extracted from the layout data (201) of the semiconductor chip in the above step 402, is synthesized with the layout pattern of the semiconductor device obtained in the above step 503 as shown in FIG. 10 (step 600).

From this pattern data, the area ratios of the gate conductor, the diffusion layer and the wiring of each layer are calculated (area ratio calculation step 601).

After that, from the process condition 701, the most appropriate area ratios of the gate conductor, the diffusion layer and the wiring of each layer are obtained (702). In this case, for example, a poly-gate is used, and the most appropriate area ratio of the gate conductor was 25%, and the most appropriate area ratio of the front-end layer wiring before CMP was not less than 65%.

According to the area ratios of the gate conductor, the diffusion layer and the wiring of each layer obtained in the area ratio calculation step 601, the pattern for the decoupling capacitor and the dummy wiring are adjusted so that the area ratio can become the most appropriate area ratio obtained in the above step 702 (step 602).

As described above, as shown in FIGS. 11(a) to 11(c), a graphic pattern of the contact used for stacking is generated (step 603), and at the same time, a graphic pattern for connecting the electric power supply is generated (step 604). This graphic pattern for connecting the electric power supply will be described later.

Then, the layout data (201) of the initial semiconductor chip is synthesized with it (step 606), and the most appropriate layout data of the semiconductor device can be obtained (step 607).

Figure 11:
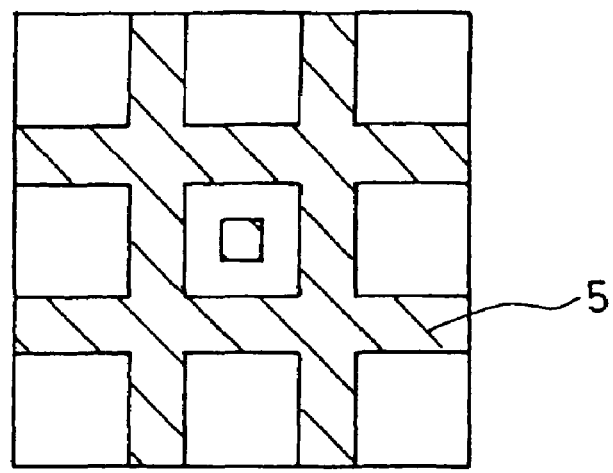
FIGS. 11(a) to 11(c) are views showing the second embodiment of the present invention.
Figure 11:
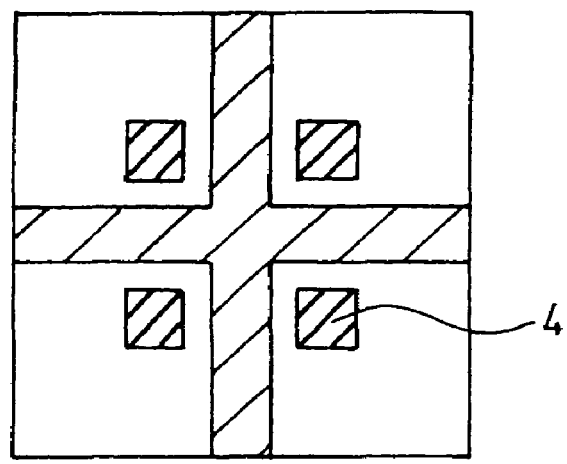
Figure 11:
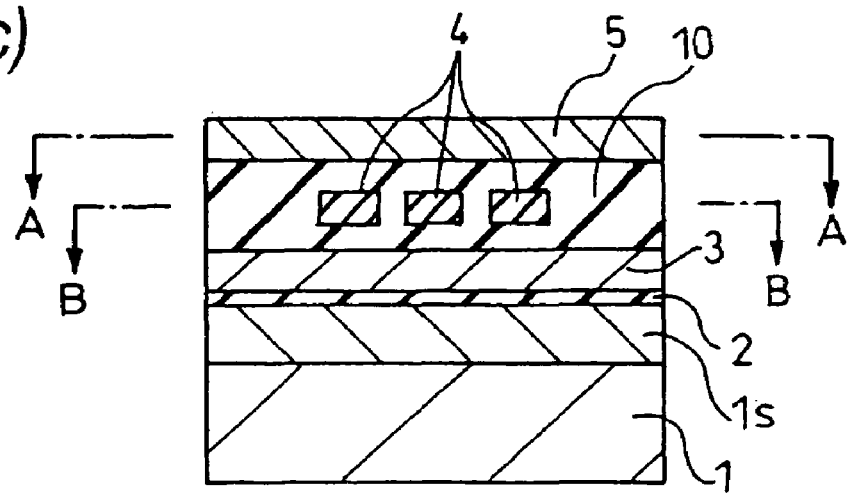

As shown in FIGS. 11(a) to 11(c), this graphic pattern for connecting the electric power supply is a dummy pattern cell formed on the MOS capacitor cell formed in such a manner that the diffusion region 1S, which is formed on the semiconductor substrate 1, and the gate electrode 3 interpose the gate oxide film 2 as an insulating film. This dummy pattern cell has a cross like pattern. A dummy pattern cell of the upper layer or the lower layer of the cross like pattern is respectively composed so that an isolated island-shaped pattern can be formed in a region corresponding to the cross region of the cross like pattern.

This dummy pattern cell includes: a first layer cell 4 having a cross like pattern and four isolated island-shaped patterns divided into the four regions by the cross like pattern as shown in FIG. 11(b); and a second layer cell 5, which is located on the upper layer or the lower layer continuing to the first layer cell 4, composed of a sharp-mark-shaped pattern which is arranged so that it can cross at four points corresponding to the four island-shaped patterns. In this structure, the first layer and the second layer respectively compose the electric power supply wiring and the ground wiring. In this case, FIG. 11(a) is a sectional view taken on line A—A in FIG. 11(c), and FIG. 11(b) is a sectional view taken on line B—B in FIG. 11(c). Reference numeral 10 is an insulating film formed between layers.

As described above, in order to connect the MOS capacitor cell to a desired electric potential such as a power supply electric potential or a ground electric potential, the wiring length is reduced so that the connection can be easily accomplished. Since it is possible to connect or not to connect keeping it in a floating condition, the connecting state can be easily controlled by whether or not through-holes are formed on the isolated pattern. When the through-holes are formed so that they can penetrate the isolated pattern, the connection with the electric power supply can be accomplished on the upper layer side or the lower layer side jumping one layer.

The decoupling capacitor, which has been spread all over right below the electric power supply, can be easily connected to the power supply electric potential when vias are provided right above the decoupling capacitor. In this case, if an upper portion of the MOS capacitor cell is open, that is, if signal lines are not formed in an upper portion of the MOS capacitor cell, vias and pads for stacking are automatically formed.

As described above, even when it is distant from the electric power supply wiring, it is possible to increase the decoupling capacitor. When the wiring is formed into a cross-shape at the same pitch as that of the MOS capacitor cells, the connection can be easily accomplished.

In this connection, when the area ratio is adjusted corresponding to the process condition and so on by the steps after the area ratio calculating step 601, it is possible to obtain a pattern highly accurately corresponding to the layout design. Further "the process condition" shows temperature, kind of gases, density of gas, gas pressure and so on applied to the process of diffusion, sputtering, etching and so on.

The reason is described as follows.

For example, the wiring pattern is formed as follows. After a conductive layer such as a polycrystalline silicon layer, an aluminum layer and a metallic silicide layer has been formed, a desired mask pattern is formed by photolithography, and etching is conducted while this mask pattern is used as a mask. In this way, the wiring pattern can be formed.

In the etching process, a conductive film exposed from the mask pattern is selectively removed. However, even when the concentration and temperature of the etchant are optimized, the etching speed fluctuates by the influence of the pattern density (area ratio) and the peripheral length of the mask pattern. Therefore, according to the density or the pattern pitch of the mask pattern, the etching accuracy becomes different. Accordingly, the etching accuracy deteriorates even when the mask pattern region is too large or too small.

In the case of forming the diffusion layer, the same problems may be encountered. When a region into which ions are injected is too small in the case of forming the diffusion layer, ions are concentrated, and it is impossible to obtain a predetermined diffusion profile.

A method of CMP (Chemical Mechanical Etching) is proposed for flattening a substrate surface. According to this method, after an insulating film has been formed on the surface, for example, by the coating method or CVD method, chemical etching is conducted while mechanically polishing, so that the surface can be flattened. However, in the case where the pattern density of the lower wiring layer is small, when a region, in which a pattern of not less than a predetermined area does not exist, is existing, even if a thick insulating layer is formed, it is impossible to flatten the surface. As a result, even after CMP has been conducted, a recess portion in which no wiring pattern exists is formed, that is, the surface is left being recessed.

In the case where the layout pattern deviates as described above, it is impossible to obtain sufficiently high pattern accuracy with respect to the layer concerned, and further the pattern accuracy of the upper layer of the layer concerned is affected, and it is impossible to obtain sufficiently high process accuracy. However, when the area ratio is adjusted in the area ratio adjusting step, the process accuracy can be enhanced.

Second Embodiment

Figure 12:
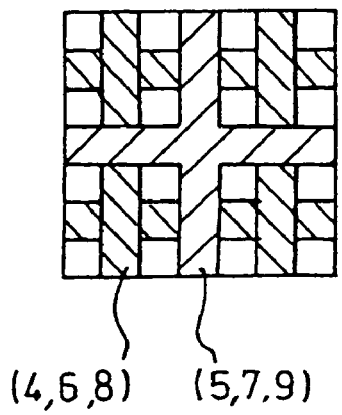
FIGS. 12(a) to 12(c) are views showing the third embodiment of the present invention.
Figure 12:
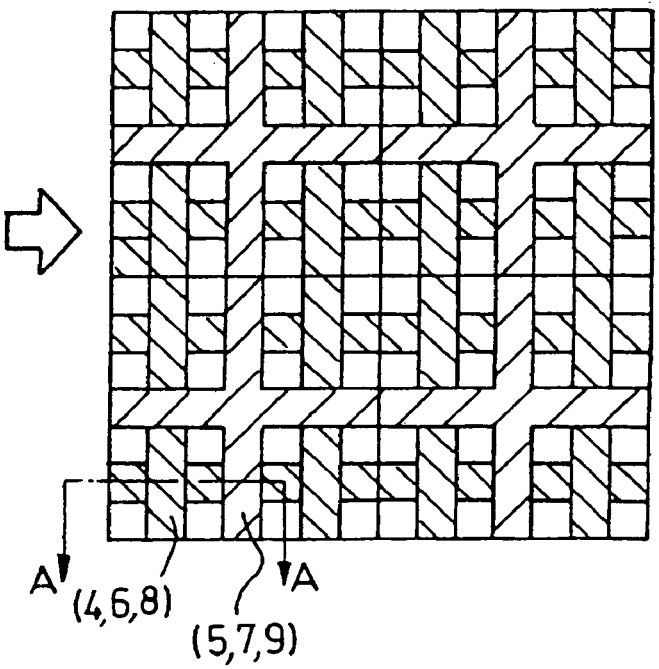
Figure 12:
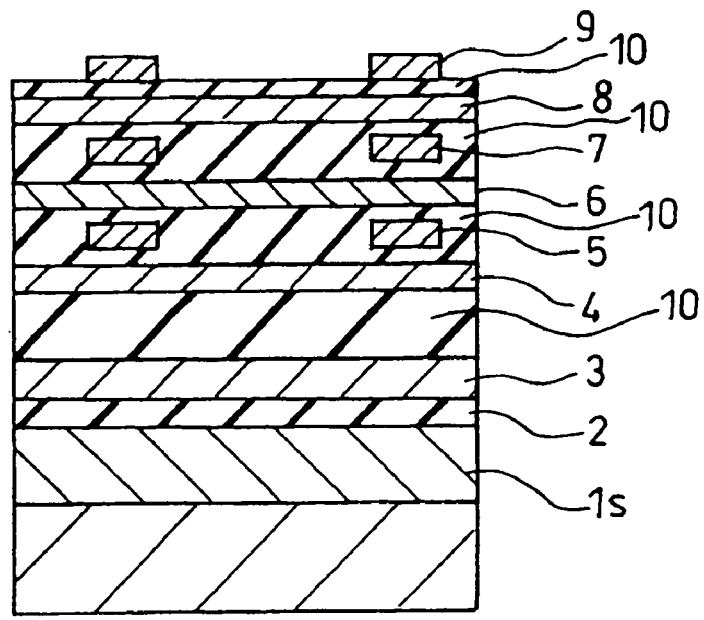

As a variation of the dummy pattern cell, it is effective to adopt the structure shown in FIGS. 12(a) to 12(c). FIG. 12(a) is a view showing a unit, FIG. 12(b) is a view showing a body in which the units are connected with each other, and FIG. 12(c) is a sectional view. As shown in these views, this dummy pattern cell may be formed in such a manner that the first layer cells 4, 6, 8 having a cross-shaped pattern formed at the same pitch as that of the cells and the second layer cells 5, 7, 9 composed of a sharp-mark-shaped pattern located on the upper or the lower layer continuing to the first layer cells 4, 6, 8 may be shifted from each other.

In this case, FIG. 12(a) is a view showing one unit, FIG. 12(b) is a view showing a combination of the units, and FIG. 12(c) is a sectional view taken on line A—A in FIG. 12(b). Reference numeral 10 is an insulating film provided between the layers.

According to the above constitution, a connection to the electric power supply wiring and the ground wiring is conducted in the lateral direction on a portion close to the cells which are spread all over. When the electric power supply wiring and the ground wiring are arranged in the upper direction of the cells, a connection may be conducted by the upper layer wiring.

As described above, when the MOS capacitor cell is connected to a desired electric potential such as a power supply electric potential or a ground electric potential, the connection can be easily accomplished by reducing the wiring length.

Third Embodiment

Figure 13:
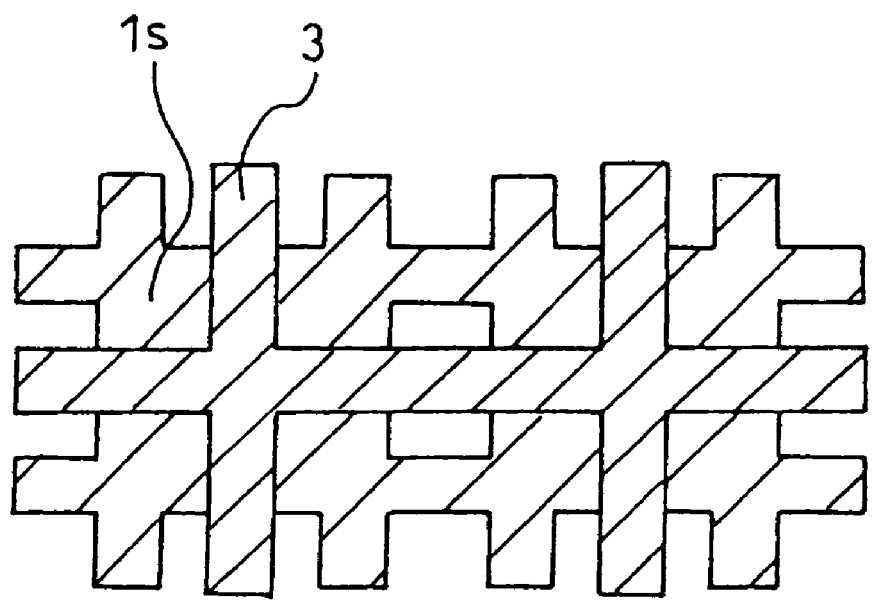
FIG. 13 is a view showing the fourth embodiment of the present invention.

When the wiring can not be utilized in the case of connecting to the electric power supply wiring and the ground wiring, as shown in FIG. 13, the cell shape may be formed in such a manner that the diffusion layers 1S are connected with each other and the gates 3 are connected with each other under the condition that the cells are arranged.

According to the above constitution, when even one portion can be connected to the electric power supply wiring or the ground wiring, all the cells connected can be utilized as cells.

It is unnecessary to form a redundant metallic wiring on the upper or the lower layer. Therefore, it is possible to prevent an increase in the wiring capacitor. Due to the foregoing, in the case of a region in which the wiring capacitor is close to a critical value, when the above structure is adopted, the coupling capacitor can be added without increasing the wiring capacitor.

Fourth Embodiment

Figure 14:
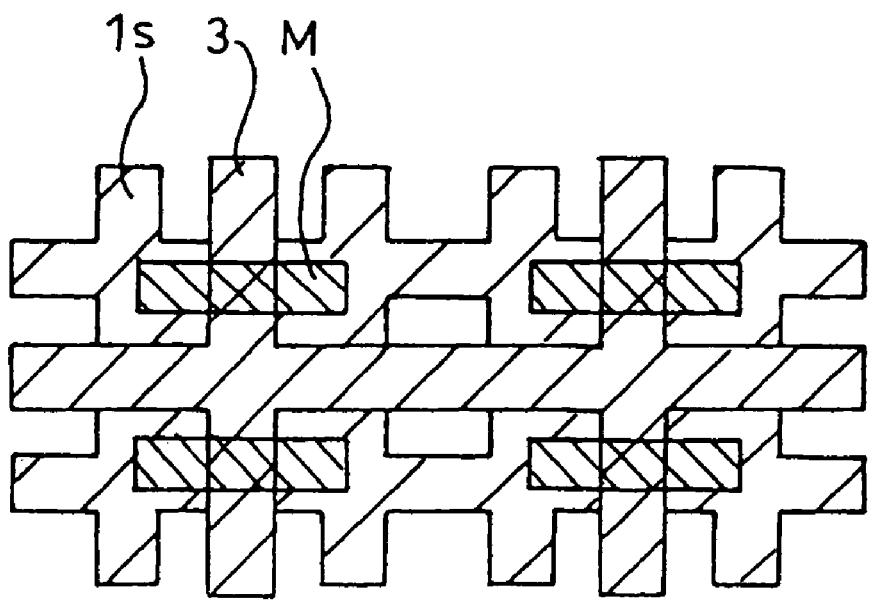
FIG. 14 is a view showing the fifth embodiment of the present invention.

Even when the diffusion layers 1S are connected with each other by the wiring M as shown in FIG. 14, the same effect can be provided.

Fifth Embodiment

According to the method of the present invention, even in the case of LSI having a thick gate oxide film region and a thin gate oxide film region as the MOS capacitor cell, the automatic arrangement wiring can be easily made. Therefore, the automatic arrangement wiring can be easily made while the conditions according to the use are being added.

For example, in the case of an analog circuit region which must have a high withstanding voltage, it is necessary to increase the film thickness of the gate oxide film. On the other hand, in the case of a logic circuit region, it is unnecessary to increase the film thickness of the gate oxide film. Therefore, it is preferable to adopt a structure in which the film thickness of the gate oxide film is increased in the analog circuit region and the film thickness of the gate oxide film is relatively decreased in the other logic region so that the decoupling capacitor can be increased. However, recently, the semiconductor device has been highly integrated and the function has been highly enhanced. Accordingly, in order to enhance the reliability, there is a tendency that a thick gate oxide film is adopted even in the logic circuit region. For example, the analog circuit region is specified by the withstanding voltage specification 3.3V, and the other logic circuit region is specified by the withstanding voltage specification 1.5V. On the other hand, in these days, the other logic circuit region is specified by the withstanding voltage specification 3.3V in some cases. In this case, when the decoupling capacitor is going to be increased so as to take measures to electromagnetic interference in the logic circuit region, it is possible to add the decoupling capacitor to the maximum.

As described above, according to the present invention, it is possible to extract the space area and form the decoupling capacitor at the maximum. Therefore, it is possible to satisfy a relation of trade-off in which one is a reduction of the gate leakage and the other is an increase in the decoupling capacitor. That is, while the gate leakage is being reduced, the decoupling capacitor can be increased.

As described above, it is possible to provide a semiconductor device having a function of reducing magnetic interference noise generated by high frequency operation.

When consideration is given to the specification and the circumstances of a region are judged from the design rule, it is possible to provide a bypass condenser, the characteristic of which is different, for each region. For example, in the outer circumferential portion of the chip close to the electric power supply wiring, in order to take measures to the occurrence of a surge, it is necessary that a withstanding voltage is high. On the other hand, inside the chip, it is unnecessary that a withstanding voltage is high. Therefore, the gate oxide film is thick in the periphery of the outer circumference of the chip, and the gate oxide film is thin inside the chip.

Further, it is possible to adopt a method in which a gate oxide film of the multiple layer structure is provided only in the periphery of the outer circumference of the chip.

The frequency characteristic is important in the periphery of the functional element. Therefore, in the case of using high frequency, it is necessary to provide a bypass condenser of a large capacitor. On the other hand, in the case of using low frequency, it is sufficient to provide a bypass condenser of a small capacitor. In this way, the capacitor of the bypass condenser may be appropriately selected according to the frequency band to be used.

Sixth Embodiment

In the first embodiment, the space area of the layout pattern is detected and the MOS capacitor cell is arranged in the space area detected. However, it is possible to adopt the following constitution. While consideration is being given to the area ratio of each layer, the dummy pattern is arranged. Finally, while consideration is being given to arrangements in the vertical direction of the diffusion region, the gate oxide film and the gate electrode, the decoupling capacitor is formed, and the layout pattern, to which the MOS capacitor is added, is formed.

Figure 15:
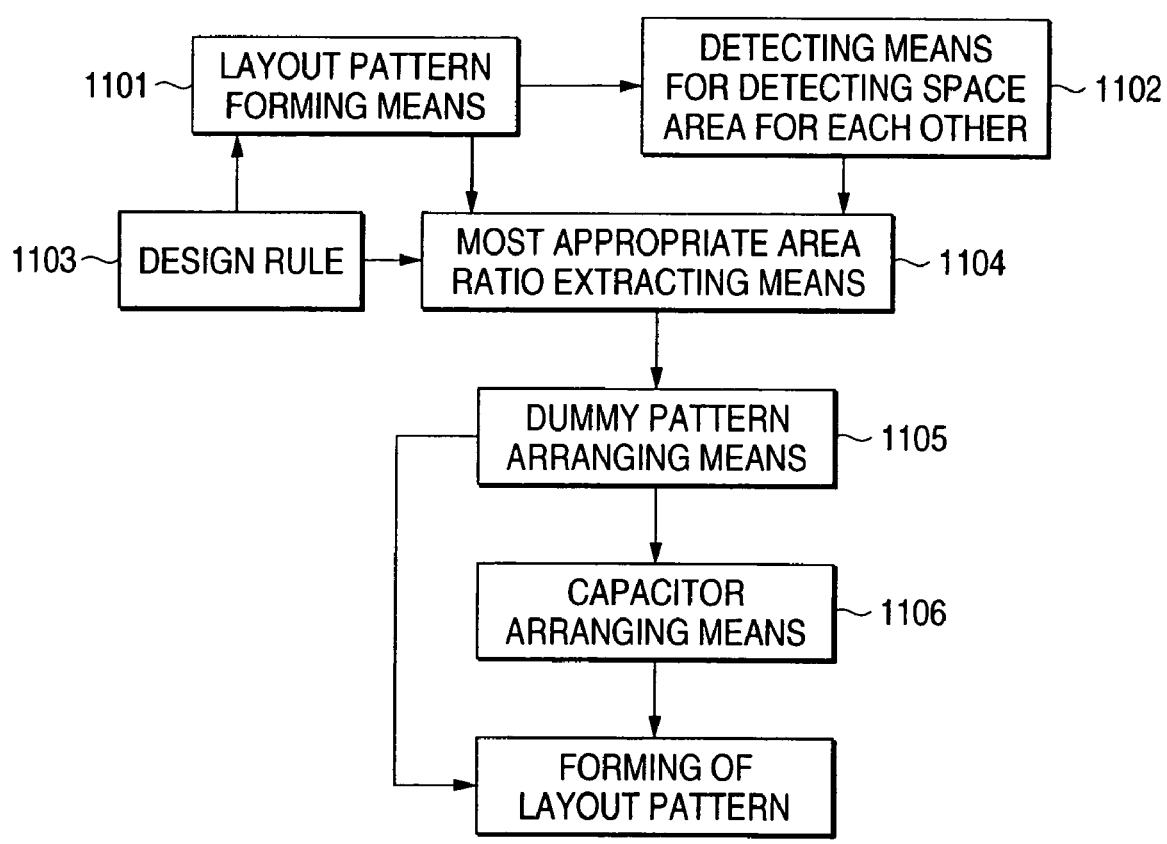
FIG. 15 is a block diagram showing a pattern generating device of the sixth embodiment of the present invention.

As shown in FIG. 15, a pattern generating device includes: a layout pattern forming means 1101 for forming a layout pattern from layout data of a semiconductor chip in which the development of LSI has been completed while consideration is given to take measures to electromagnetic interference and the verification of the layout has been completed; a space area detecting means 1102 for detecting a space area according to the layout pattern; a most appropriate area ratio extracting means 1104 for extracting the most appropriate area ratio for forming a pattern of each layer according to the design rule 1103; a dummy pattern arranging means 1105 for arranging a dummy pattern when an area ratio of each layer is calculated from the space area region detecting means 1102 so that the calculated area ratio can be the most appropriate area ratio; and a capacitor arranging means 1106 in which while consideration is given to a positional relation in the vertical direction between the diffusion region and the gate conductor in the dummy pattern, it is judged whether or not the decoupling capacitor can be added, and the electric power supply wiring and the ground wiring are connected to the region to which the decoupling capacitor can be added.

Figure 16:
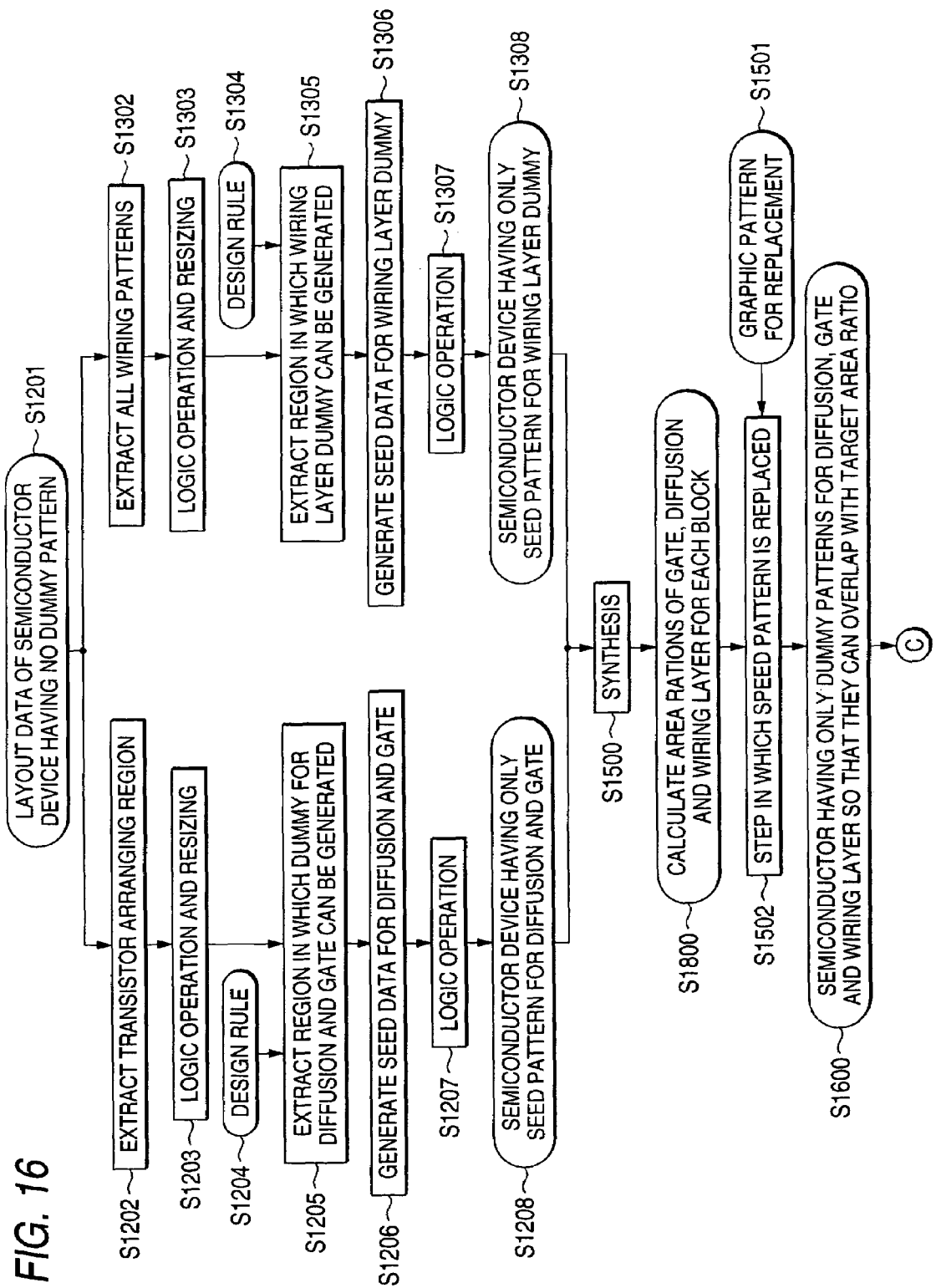
FIG. 16 is a flow chart showing a pattern generating method of the sixth embodiment of the present invention.
Figure 17:
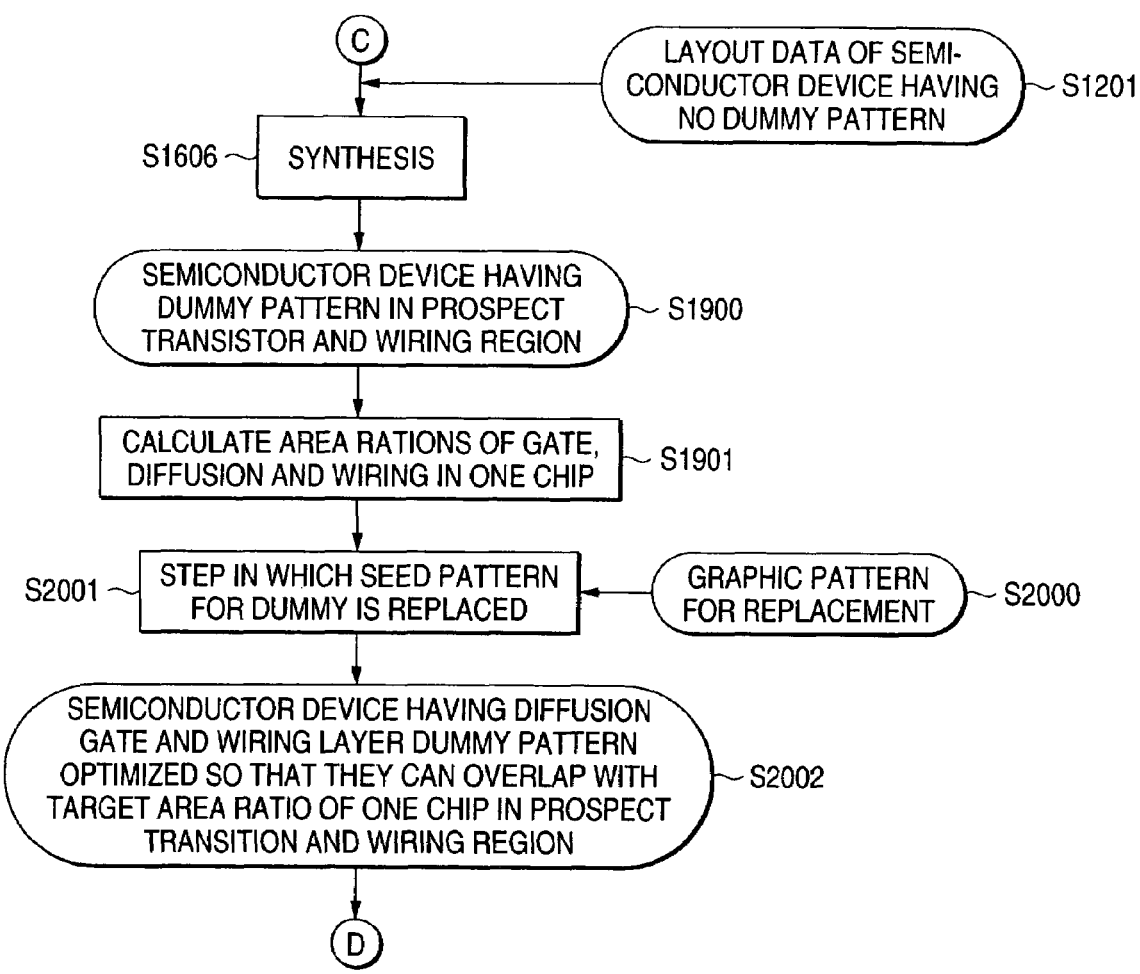
FIG. 17 is a flow chart showing a pattern generating method of the sixth embodiment of the present invention.
Figure 18:
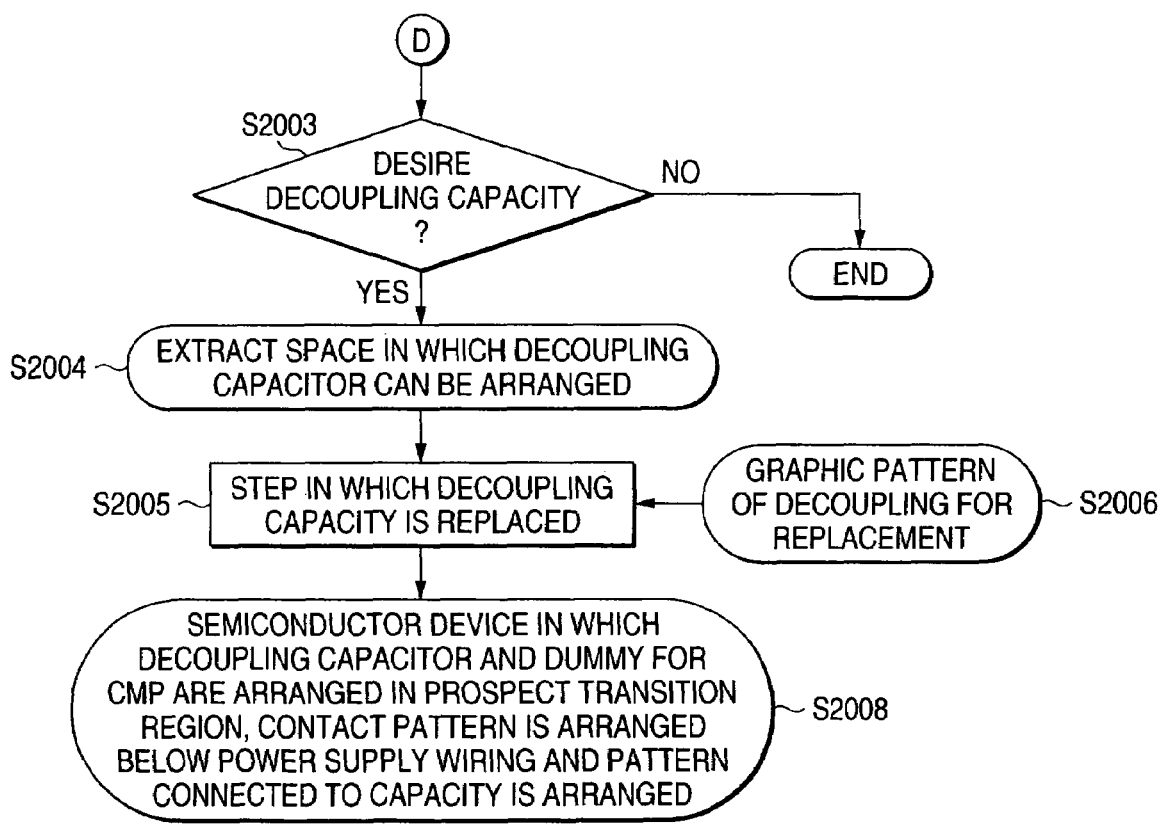
FIG. 18 is a flow chart showing a pattern generating process of the sixth embodiment of the present invention.

The pattern generating method in this case is shown in the flow chart of FIGS. 16 to 18.

From the layout data of the semiconductor chip, the development of LSI of which has been completed while consideration is being given to taking measures to electromagnetic interference and the layout of which has been verified (S1201), the transistor arrangement region T is extracted (shown in FIG. 5) (step S1201). In this case, the left lower point and the right upper point of the semiconductor chip are positioned all over the process, and then the layout data is generated while the two points are used as a reference point.

Then, when this transistor arrangement region T and the semiconductor chip region are subjected to a logic operation and inverted, a region in which no transistor is arranged on the semiconductor chip is extracted, and a resizing step in which the width of this region is reduced by a predetermined width W is executed (logic operation step S1203). By this inversion, a region, in which no transistor is arranged is obtained. When this region is reduced by resizing, it is possible to obtain a space area V in which a dummy pattern cell can be formed as shown in FIG. 6.

Further while consideration is being given to a distance between the adjacent patterns capable of being formed according to the design rule (S1204), a region in which the dummy pattern can be formed is extracted (step S1205). In this case, the step S1205 is executed for each layer of the diffusion layer and the gate conductor.

After that, the seed data for the dummy pattern for forming the diffusion region and the seed data for the dummy pattern for forming the gate conductor are generated (step S1206).

Figure 19:
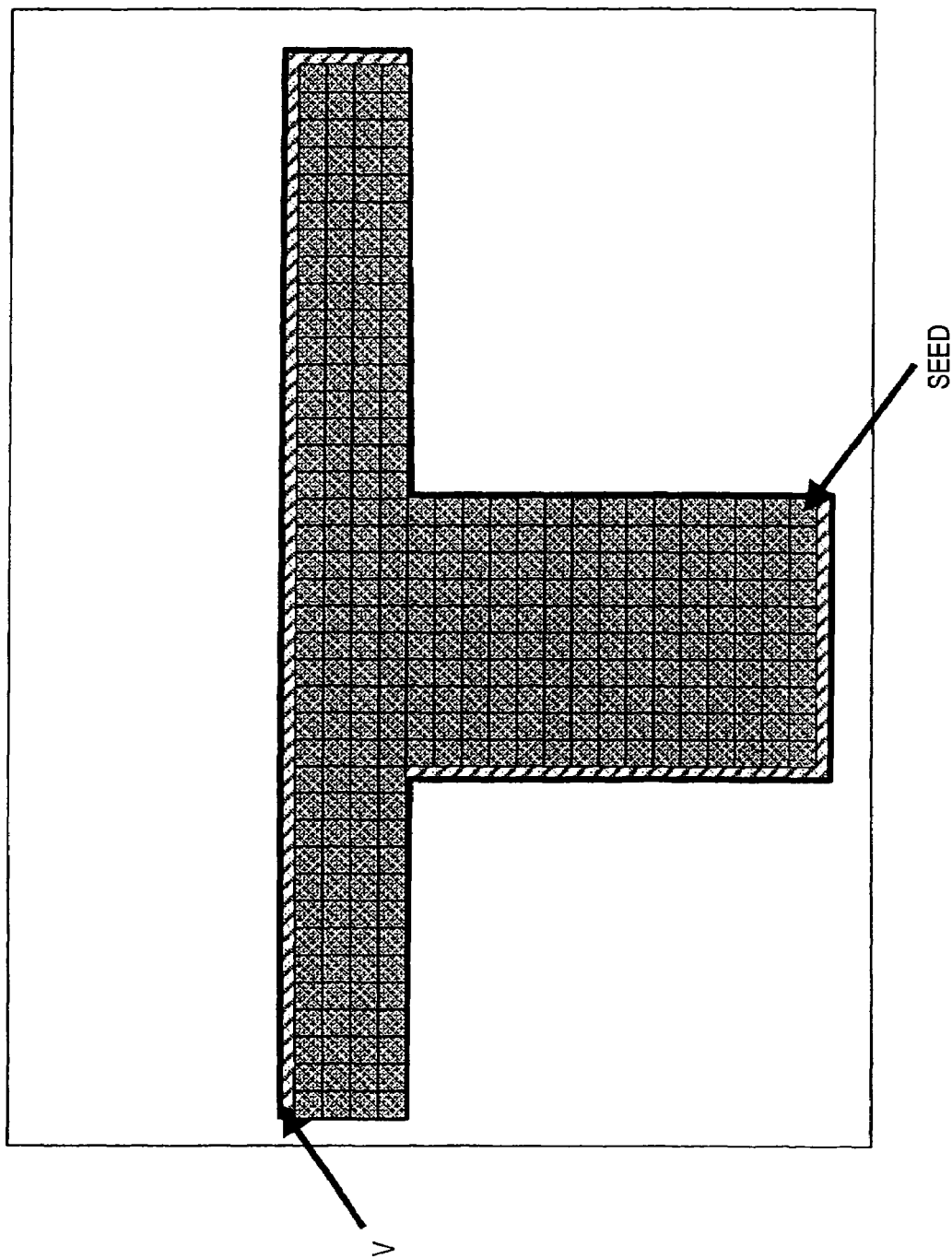
FIG. 19 is a schematic illustration showing a pattern generating process of the sixth embodiment of the present invention.

Each of the seed data for the dummy pattern for forming the diffusion region and the seed data for the dummy pattern for forming the gate conductor, and the region in which the dummy pattern can be formed are subjected to a logic operation (step S1207). In this way, it is possible to obtain a semiconductor device having only the seed pattern for the dummy pattern for forming the diffusion region and the seed pattern for the dummy pattern decoupling capacitor for forming the gate conductor as shown in FIG. 19 (step S1208).

On the other hand, from the layout data (S1201) of the semiconductor chip, all wiring patterns are extracted (step S1302).

Then, when this wiring pattern arrangement region and the semiconductor chip region are subjected to a logic operation and inverted, a region in which no transistor is arranged on the semiconductor chip is extracted, and a resizing step in which the width of this region is reduced by a predetermined width W is executed (logic operation step S1303). By this inversion, a region, in which no transistor is arranged is obtained. When this region is reduced by resizing, it is possible to obtain a space area in which a wiring layer dummy cell can be formed.

Further while consideration is being given to a distance between the adjacent patterns capable of being formed according to the design rule (S1304), a region in which the dummy wiring can be formed is extracted (step S1305).

After that, the seed data for the dummy wiring is generated (step S1306).

Then, the seed data for the dummy wiring and the space area VC in which the wiring layer dummy cell can be formed are subjected to a logic operation (step S1307), and a semiconductor device having only this seed pattern for wiring layer dummy can be obtained (step S1308).

The thus obtained seed pattern for the wiring layer dummy, the seed data for the dummy pattern for forming the diffusion region and the seed data for the dummy pattern for forming the conductor are synthesized with each other (step S1500), and synthesis is conducted with respect to the gate conductor, the diffusion region and the wiring for each block (each small region). Then, an area ratio is extracted for each block with respect to each layer (step S1800). A plurality of graphic patterns for replacement are prepared (step S1501). In the case of a region, which extends to a boundary so that it can not be formed, the seed pattern is replaced by a small seed pattern. In the case of a region which is capable of being formed, the seed pattern is replaced with the most appropriate seed pattern (step S1502). In this way, it is possible to obtain a semiconductor device having only the dummy pattern for the diffusion layer, the dummy pattern for the gate conductor and the dummy pattern for the wiring layer which have been optimized so that it can be overlapped with the target area ratio (step S1600).

In this case, one block is not one entire chip but a frame having a window of a certain size, and the area is calculated in the frame. In this way, in the space area in the window in which a pattern, the area ratio of which is low, exists in the original layout, it is possible to arrange a dummy pattern, the area ratio of which is high. Therefore, this method is very effective for flattening the entire chip.

In this way, it is possible to complete a semiconductor device having only the dummy pattern for the diffusion region, the gate conductor dummy pattern and the dummy pattern for wiring layer, which have been optimized so that it can be overlapped with the target area ratio which is set according to the most appropriate area ratio.

After that, the layout pattern of the semiconductor device, which is obtained in the above step 1600, having only the dummy pattern for the diffusion region, the gate conductor dummy pattern and the dummy pattern for wiring layer, which have been optimized, is synthesized with the layout pattern, which has been extracted from the layout data (S1201) of the semiconductor chip, for each layer (step S1606). When the layout data of the semiconductor device having no dummy pattern is synthesized as described above, it is possible to complete a semiconductor device having a dummy pattern in a region in which no transistor and no wiring region are arranged.

After that, from the process condition, the most appropriate area ratio of the gate conductor, the diffusion layer and the wiring as one chip is calculated (S1901).

Then, the area ratio as one chip is calculated again. When the area ratio is too low or too high, the dummy pattern cell is appropriately replaced by the dummy pattern cell D1 selected from the graphic pattern 2000 used for replacement (step S2001).

Figure 20:
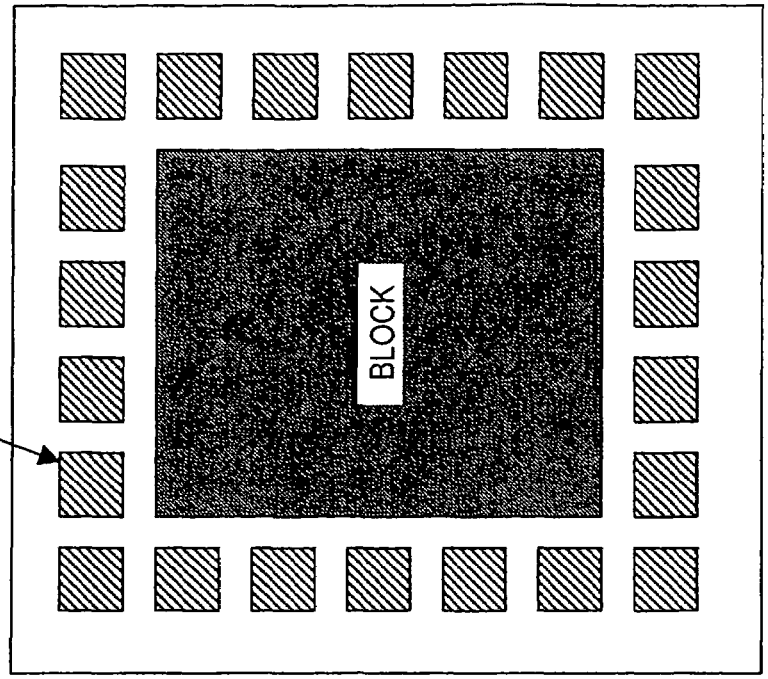
FIGS. 20(a) and 20(b) are schematic illustrations showing a pattern generating process of the sixth embodiment of the present invention.
Figure 20:
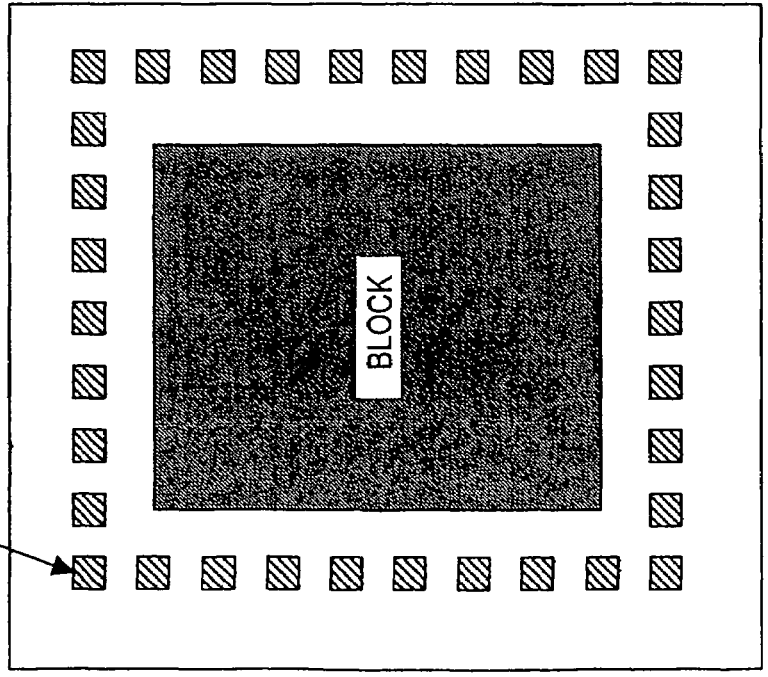

In this way, as shown in FIGS. 20(*a*) and 20(*b*), the dummy pattern cell D2, the area ratio of which has been adjusted to be the most appropriate one as one chip, can be generated (step 2002).

In this step 2001 in which the cell is replaced, a position at which the dummy damper is uniformly arranged can be previously specified. Therefore, in the case where the area ratio is too low, the dummy pattern in the region arranged uniformly is uniformly changed into a dummy pattern, the area ratio of which is high, so that a dummy pattern, the area ratio of which is adjusted to a desired value, can be generated. On the other hand, in the case where the area ratio is too high, the dummy pattern in the region arranged uniformly is uniformly changed into a dummy pattern, the area ratio of which is low, so that a dummy pattern, the area ratio of which is adjusted to a desired value, can be generated.

Further, as shown in FIG. 18, the decoupling capacitor is added.

First, it is judged whether or not it is desired to add the decoupling capacitor (step 2003). When it is judged to add the decoupling capacitor, a space in which the decoupling capacitor can be arranged is extracted (step 2004). In this case, it is judged whether or not the diffusion region pattern and the gate conductor pattern are existing in the vertical direction being overlapped with each other, and a space in which the decoupling capacitor can be formed is extracted. In this embodiment, when the pattern of each layer is arranged, a left lower portion and a right upper portion of the chip are confirmed and positioned. Therefore, when the dummy pattern of each layer is arranged at the same pitch and the area ratio is adjusted while the pitch is being adjusted in such a manner that all the dummy patterns are used, every two dummy patterns is used or every three patterns is used, it is possible for the patterns to be automatically stacked on each other in the vertical direction.

Accordingly, the decoupling capacitor is replaced by using the decoupling graphic pattern 2008 used for replacement (step 2005), and the layout pattern of the semiconductor device, in which the area ratio adjustment and the decoupling capacitor addition are conducted, can be generated (step 2008). In this case, when either the diffusion region pattern or the gate conductor pattern is adjusted, the decoupling capacitor can be added.

Concerning the connection of the electric power supply wiring and the ground wiring with the decoupling capacitor cell, when the dummy wiring cell, which was explained in the second to the fifth embodiment as the dummy wiring pattern, is used, the connection can be easily accomplished.

In the manner described above, the most appropriate data of the semiconductor device can be obtained. Therefore, it is possible to provide a semiconductor device having an excellent function of reducing electromagnetic interference generated by the high frequency operation.

While consideration is being given to the specification, when the circumstances of a region is judged by the design rule, it is possible to provide a bypass condenser, the characteristic of which is different for each region. For example, in the outer circumferential section of the chip close to the electric power supply wiring, in order to avoid the influence of a surge, the withstanding voltage must be high. On the other hand, inside the chip, it is unnecessary that the withstanding voltage is high. Therefore, in the periphery of the outer circumference of the chip, the gate oxide film is thick, and inside the chip, the gate oxide film is thin.

A gate oxide film of multi-layer structure may be used only in the periphery of the outer circumference of the chip.

In the periphery of a functional element, the frequency characteristic is important. In the case of high frequency, it is necessary to form a bypass condenser, the capacitor of which is large. On the other hand, in the case of low frequency, it is sufficient to form a bypass condenser, the capacitor of which is small. In this way, the capaciter of the bypass condenser may be appropriately selected according to the frequency band to be used.

In this connection, both P channel capacitor cell and N channel capacitor cell are prepared, and when it is impossible to supply electric power to the P channel capacitor cell, the N channel capacitor cell may be rearranged so that it can be used.

When a capacitor cell having both capacities of P channel and N channel is prepared so that both capacities of P channel and N channel are arranged, the capacitor can be arranged without being biased to one-conductor type diffusion region. Therefore, the uniformity can be ensured and the concentration of ions can be prevented, and a desired diffusion profile can be obtained.

As explained above, according to the semiconductor device of the present invention, a cell is arranged in a space area so that a decoupling capacitor an be increased. Therefore, it is possible to form a condenser by a simple structure while utilizing a space area without increasing a chip area. Therefore, the generation of noise can be reduced.

In the case of generating a pattern, after a layout pattern of a chip is generated, a space area in which no other layers are existing is automatically searched by utilizing graphic logic operation and resizing processing, and the thus searched region is utilized as a decoupling capacitor arrangement region. Therefore, it is possible to automatically generate a pattern, and the reduction of noise can be made with high accuracy.

The wiring layer to be connected can be formed as a pattern. Therefore, the reduction of noise can be accomplished with higher accuracy. In this case, it is necessary to arrange while keeping the design rule. Due to the foregoing, it is possible to form a reliable pattern with higher accuracy.

According to the above method, when a space area is detected and an MOS capacitor cell is formed in the space area and wiring is conducted at a necessary position, the automatically arranging wiring for increasing the decoupling capacitor can be easily accomplished.

What is claimed is:

1. A method of generating a pattern for a semiconductor device comprising:
    a layout pattern forming step of designing and arranging a layout pattern of a function element according to function information of a semiconductor chip;
    a space area detecting step of detecting a space area which has a portion overlapping a layout pattern of at least one power supply wiring in a different layer and in which no layout pattern exists in the same layer of the space area;
    a judging step of judging whether or not an MOS capacitor cell, the insulating film of which is a gate oxide film, can be arranged in the space area;
    a step of arranging the MOS capacitor cell in the space judged that the MOS capacitor cell can be arranged; and
    a wiring arrangement step of forming a wiring so that a gate conductor of the MOS capacitor cell can be connected to a first electric potential and a substrate can be connected to a second electric potential.

2. A method of generating a pattern for a semiconductor device according to claim 1, wherein the wiring arrangement step includes a step in which the gate conductor of the MOS capacitor cell is connected to a wiring of an electric power supply and a step in which the substrate is connected to a ground wiring.

3. A method of generating a pattern for a semiconductor device according to claim 2, wherein the wiring arrangement step includes a step in which a wiring layout pattern is generated so that a contact for connecting a wiring formed in an upper layer to the gate conductor can be formed and the wiring can be connected to the electric power supply wiring.

4. A method of generating a pattern for a semiconductor device according to claim 2, further comprising a step in which a wiring layout pattern is generated so tat a contact of connecting the wiring formed in the upper layer to the substrate can be formed and the substrate can be connected to the ground wiring.

5. A method of generating a pattern for a semiconductor device according to claim 3, wherein the contact is connected to a contact formed in a portion, in which the electric power supply wiring or the ground wiring exists on a lower layer, via the wiring.

6. A method of generating a layout pattern for a semiconductor device according to claim 3, further comprising a step of extracting a region having no layout pattern of the function element and having no signal line above, wherein the wiring is arranged in the extracted region.

7. A method of generating a layout pattern for a semiconductor device according to claim 6, the step of generating a layout pattern of the wiring comprising the step of:
   detecting whether or not a front-end layer pattern exists from the layout pattern;
   detecting whether or not a layout pattern of a function element exists on the same layer; and
   extracting a region in which a wiring can be generated.

8. A method of generating a layout pattern for a semiconductor device according to claim 6, the step of generating a layout pattern of a wiring comprising the step of:
   detecting whether or not a front-end pattern exists from the layout pattern and also detecting whether or not an upper layer pattern exists from the layout pattern;
   detecting whether or not a layout pattern of a function element exists on the same layer; and
   extracting a region in which an intermediate layer wiring, which is located between the front-end layer pattern and the upper layer pattern, can be generated.

9. A method of generating a pattern for a semiconductor device according to claim 1, wherein the wiring arrangement step is composed so that two continuous layers of dummy pattern cells have a cross like pattern and the dummy pattern cell of each layer has an island-shaped isolated pattern in a region corresponding to a cross region of the cross like pattern.

10. A method of generating a pattern for a semiconductor device according to claim 1, wherein the dummy pattern cell is composed of a first layer cell having a cross like pattern and an isolated island-shaped pattern in each of the four regions divided by the cross like pattern and also composed of a second layer cell, the pattern of which is a sharp-mark-shape arranged so that it crosses at four points corresponding to the island-shaped pattern, located on an upper layer or a lower layer continuing to the first layer cell, and the first layer and the second layer respectively compose an electric power supply wiring and a ground wiring.

11. A method of generating a pattern for a semiconductor device according to claim 1, further comprising;
   a step of extracting an area ratio from the layout pattern of each layer composing the function element, the MOS capacitor element and the wiring; and
   a dummy pattern adding step of adding a dummy pattern to the layout pattern so that the area ratio of the mask pattern of each layer can be adjusted to be the same while giving consideration to the most appropriate area ratio of the layout pattern for each layer obtained according to the process condition of each layer composing the layout pattern,
   wherein the area ratio of each layer is adjusted to be the same.

12. A method of generating a semiconductor device according to claim 11, further comprising:
   a step of dividing a layout pattern, which is formed in the layout pattern forming step, into small regions of a predetermined size;
   a step of extracting an area ratio of the layout pattern for each small region divided; and
   a dummy pattern adding step of adding a dummy pattern so that the area ratio of a mask pattern can be adjusted to be the same,
   wherein the area ratio of each layer for each small region is adjusted to be the same.

13. A method of generating a pattern for a semiconductor device according to claim 12, further comprising:
   a step of preparing a plurality of types of dummy pattern cells, the area ratios of which are different from each other; and
   the dummy pattern adding step including a step of selecting a predetermined dummy pattern cell according to the area ratio of the small region concerned.

14. A method of generating a pattern for a semiconductor device according to claim 12, further comprising a step in which an area ratio after the dummy pattern has been formed is calculated, it is judged whether or not the area ratio is in a predetermined range, when the area ratio is not in the predetermined range, some of the dummy patterns are replaced, and the most appropriate dummy cell is calculated.

15. A method of generating a pattern for a semiconductor device according to claim 11, wherein the dummy pattern adding step is executed for at least one of the wiring layer, the diffusing layer, the gate conductor and the well.

16. A method of manufacturing a semiconductor device comprising:
   a step of forming a mask pattern in each step according to the method described in claim 1, and
   a step of executing each process with the mask pattern so as to form a semiconductor device.

17. A semiconductor device comprising a pattern used for a semiconductor device generated by the method described in claim 1.

18. A semiconductor device according to claim 17 characterized in that: the semiconductor device is an aggregation composed of dummy capacitor cells of the same size; and the semiconductor device includes at least one dummy capacitor cell not electrically connected.

19. A device for generating a pattern used for a semiconductor device comprising:
   a layout pattern forming means for forming a layout pattern from layout data of a semiconductor chip;
   a space area detecting means for detecting a space area which has a portion overlapping a layout pattern of at least one power supply wiring in a different wiring layer in which no layout pattern exists in the same layer of the space area on the semiconductor chip;
   a logic operation means for conducting a logic operation of a region detected by the space area detecting means and a design rule while consideration is given to technology by the design rule from the layout pattern formed by the layout pattern forming means; and
   an arranging means for arranging a region extracted by the logic operation means so that it can be a decoupling capacitor adding arranging region.

20. A semiconductor device comprising a pattern used for a semiconductor device generated by the device described in claim 19.

21. A method of manufacturing a semiconductor device comprising:
   a step of forming a mask pattern in each step according to the device described in claim 19;
   and a step of executing each process with the mask pattern so as to form a semiconductor device.

* * * * *